United States Patent
Mizutani et al.

(10) Patent No.: US 6,811,947 B2
(45) Date of Patent: Nov. 2, 2004

(54) POSITIVE RESIST COMPOSITION

(75) Inventors: Kazuyoshi Mizutani, Shizuoka (JP);
Tomoya Sasaki, Shizuoka (JP);
Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/372,240

(22) Filed: Feb. 25, 2003

(65) Prior Publication Data

US 2003/0194641 A1 Oct. 16, 2003

(30) Foreign Application Priority Data

Feb. 26, 2002 (JP) ........................................ 2002-049963

(51) Int. Cl.$^7$ .............................................. G03F 7/039
(52) U.S. Cl. ..................... 430/270.1; 430/907; 430/914
(58) Field of Search .............................. 430/270.1, 907, 430/914

(56) References Cited

U.S. PATENT DOCUMENTS 6,610,456 B2 * 8/2003 Allen et al.

| | | |
|---|---|---|
| 2002/0009668 A1 | 1/2002 | Nishimura et al. |
| 2002/0055060 A1 | 5/2002 | Taylor et al. |
| 2002/0061464 A1 * | 5/2002 | Aoai et al. |
| 2002/0155376 A1 * | 10/2002 | Hashimoto et al. |
| 2002/0160297 A1 * | 10/2002 | Fedynyshyn et al. |
| 2002/0197557 A1 * | 12/2002 | Kishimura et al. |

FOREIGN PATENT DOCUMENTS

| | | |
|---|---|---|
| WO | WO 11/17712 A1 | 3/2000 |
| WO | WO 00/67072 A1 | 11/2000 |
| WO | WO 01/63362 A2 | 8/2001 |
| WO | WO 02/36533 A1 | 5/2002 |
| WO | WO 022/36646 A1 | 5/2002 |

* cited by examiner

*Primary Examiner*—Richard L. Schilling
(74) *Attorney, Agent, or Firm*—Sughrue Mion, PLLC

(57) ABSTRACT

A positive resist composition comprising (A) a resin, which is decomposed by the action of an acid to increase solubility in an alkali developing solution, having a repeating unit represented by formula (Y) defined in the specification, (B) a compound capable of generating an acid upon irradiation of an actinic ray or radiation, and (C) a solvent.

17 Claims, No Drawings

POSITIVE RESIST COMPOSITION

FIELD OF THE INVENTION

The present invention relates to a positive resist composition suitable for use in a microlithography process, for example, the production of VLSI and high capacity microtips, and in other photofabrication processes. More particularly, the present invention relates to a positive resist composition capable of forming a highly precise pattern using a vacuum ultraviolet ray of not more than 160 nm.

BACKGROUND OF THE INVENTION

The degree of integration of integrated circuits has recently become much higher, and the processing of ultra-fine patterns having a line width of a quarter micron or below is required in the production of semiconductor substrate, for example, VSLI. As one means for the formation of fine pattern, it is known to make an exposure light source for use in the production of resist pattern shorter.

For instance, in the production of semiconductor device having the degree of integration up to 64 Mbits, an i-line (365 nm) of high pressure mercury lamp has been employed as the light source. As a positive resist corresponding to the light source, a large number of compositions containing a novolac resin and a naphthoquinone diazide compound as a photosensitive substance have been developed. These compositions have achieved full success in the processing of line width up to about 0.3 $\mu$m. Also, in the production of semiconductor device having the degree of integration of 256 Mbits or more, a KrF excimer laser beam (248 nm) is employed as the light source in place of the i-line.

In recent years, for the purpose of the production of semiconductor device having the degree of integration of 1 Gbit or more, as a light source having shorter wavelength, the use of an ArF excimer laser beam (193 nm) and further, the use of an F2 excimer laser beam (157 nm) have been investigated in order to form a pattern of not more than 0.1 $\mu$m.

In response to such a trend of using light source having a shorter wavelength, constituents of the resist materials and structure of compounds used for the constituents have been greatly changed.

As a resist composition for exposure using the KrF excimer laser beam, a composition in which a resin including a basic skeleton of poly (hydroxystyrene) that has a small absorption in the region of around 248 nm and being protected by an acid-decomposable group is used as the main component and a compound that generates an acid upon irradiation of a far ultraviolet ray (a photo-acid generator) is used in combination, that is, a so-called chemical amplification resist has been developed.

Also, as a resist composition for exposure using the ArF excimer laser beam (193 nm), a chemical amplification resist using an acid-decomposable resin in which an alicyclic structure that does not have an absorption in the region of around 193 nm is introduced into the main chain or side chain thereof has been developed.

It has been found in case of using an F2 excimer laser beam (157 nm), however, that since the above-described alicyclic group-containing resin still has a large absorption in the region of around 157 nm, it is insufficient for obtaining the desired pattern of not more than 0.1 $\mu$m. In such circumstances, it is reported that a resin having a fluorine atom (a perfluoro structure) introduced therein has sufficient transparency in the region of around 157 nm in *Proc. SPIE.*, Vol. 3678, page 13 (1999). Structures of effective fluorine resins are also proposed, for example, in *Proc. SPIE.*, Vol. 3999, page 330 (2000), ibid., page 357 (2000), ibid., page 365 (2000) and WO 00/17712. Thus, investigations of resist composition including the fluorine resin have been made.

However, the resist composition for exposure using an F2 excimer laser beam containing such a fluorine resin has problems, for example, line edge roughness and developing time dependency. Therefore, it is desired to resolve these problems.

The term "line edge roughness" used herein means a phenomenon wherein an edge between a line pattern of resist and a surface of substrate irregularly fluctuates in the direction vertical to the line due to the characteristics of resist. When the pattern is observed from just above, the edge is uneven (approximately from several nm to several dozen nm). Since the unevenness is transferred to the substrate in an etching step, the large unevenness causes a defect in electric properties thereby resulting in yield reduction.

The term "developing time dependency" used herein means a degree of change in pattern size depending on the fluctuation of developing time. When the developing time dependency is large, the pattern size uniformity in a wafer is degraded and control of the developing process becomes difficult.

SUMMARY OF THE INVENTION

Therefore, an object of the present invention is to provide a positive resist composition suitable for using an exposure light source having a wavelength of not more than 160 nm, particularly an F2 excimer laser beam (157 nm).

Another object of the present invention is to provide a positive resist composition, which exhibits sufficient transmittancy in case of using an exposure light source of 157 nm and has small line edge roughness and developing time dependency.

Other objects of the present invention will become apparent from the following description.

As a result of the intensive investigations on the above-described characteristics of positive resist composition, it has been found that the objects of the present invention can be accomplished by using the specific composition described below to complete the present invention.

Specifically, the present invention includes the following configurations:

(1) A positive resist composition comprising (A) a resin, which is decomposed by the action of an acid to increase solubility in an alkali developing solution, having a repeating unit represented by formula (Y) shown below, (B) a compound capable of generating an acid upon irradiation of an actinic ray or radiation, and (C) a solvent.

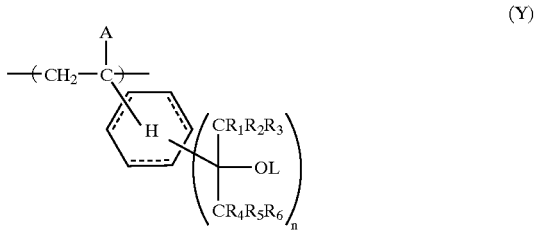

In formula (Y), $R_1$ to $R_6$, which may be the same or different, each represent a hydrogen atom, a fluorine atom, an alkyl group or a substituted alkyl group in which at least one hydrogen atom is substituted with a fluorine atom, provided that at least one of $R_1$ to $R_6$ is a fluorine atom.

L represents a hydrogen atom or a group decomposable upon the action of an acid.

n represents 1 or 2. When n is 2, two $R_1$'s to $R_6$'s and L's may be the same or different from each other.

A represents a hydrogen atom, a fluorine atom, a chlorine atom, a methyl group, a cyano group or a trifluoromethyl group.

The structural formula (YA) shown below represents a benzene ring structure hydrogenated at least partially.

(YA)

DETAILED DESCRIPTION OF THE INVENTION

The present invention also includes the following preferred embodiments.

(2) The positive resist composition as described in item (1) above, wherein the compound capable of generating an acid upon irradiation of an actinic ray or radiation of (B) is (B1) a compound capable of generating an organic sulfonic acid upon irradiation of an actinic ray or radiation.

(3) The positive resist composition as described in item (2) above, which further comprises (B2) a compound capable of being decomposed upon irradiation of an actinic ray or radiation to generate a carboxylic acid.

Now, the compounds for use in the positive resist composition of the present invention are described in detail below.

[1] Resin (Component (A))

In the positive resist composition of the present invention, a resin, which is decomposed by the action of an acid to increase solubility in an alkali developing solution, having a repeating unit represented by formula (Y) shown below is used as a resin of Component (A).

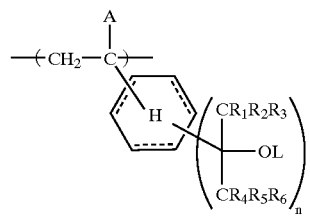

(Y)

In formula (Y), $R_1$ to $R_6$, which may be the same or different, each represent a hydrogen atom, a fluorine atom, an alkyl group or an alkyl group in which at least one hydrogen atom is substituted with a fluorine atom, provided that at least one of $R_1$ to $R_6$ is a fluorine atom. L represents a hydrogen atom or a group decomposable upon the action of an acid. n represents 1 or 2. When n is 2, two $R_1$'s to $R_6$'s and L's may be the same or different from each other. A represents a hydrogen atom, a fluorine atom, a chlorine atom, a methyl group, a cyano group or a trifluoromethyl group. The structural formula (YA) shown below represents a benzene ring structure hydrogenated at least partially.

(YA)

The alkyl group represented by any one of $R_1$ to $R_6$ is preferably an alkyl group having from 1 to 8 carbon atoms and includes, for example, methyl, ethyl, propyl, n-butyl, sec-butyl, hexyl, 2-ethylhexyl and octyl groups.

The alkyl group in which at least one hydrogen atom is substituted with a fluorine atom includes the alkyl group as described above in which at least one hydrogen atom is substituted with a fluorine atom. Of the alkyl group in which at least one hydrogen atom is substituted with a fluorine atom, a perfluoroalkyl group is preferred and a trifluoromethyl group is particularly preferred.

A hydrogenation rate of the benzene ring in the structural formula (YA) is ordinarily from 10 to 100%, preferably from 20 to 100%, and more preferably from 30 to 70%.

Specific examples of the repeating unit represented by formula (Y) are set forth below, but the present invention should not be construed as being limited thereto.

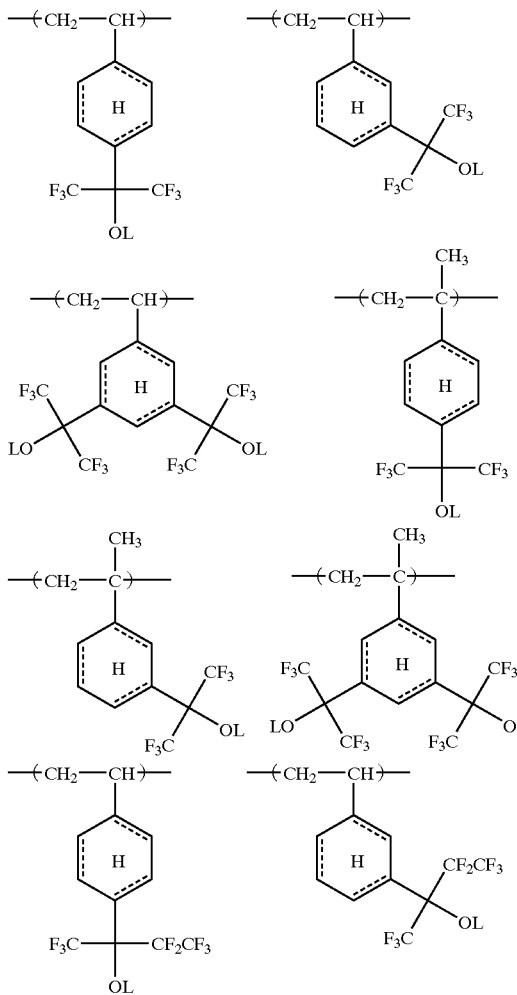

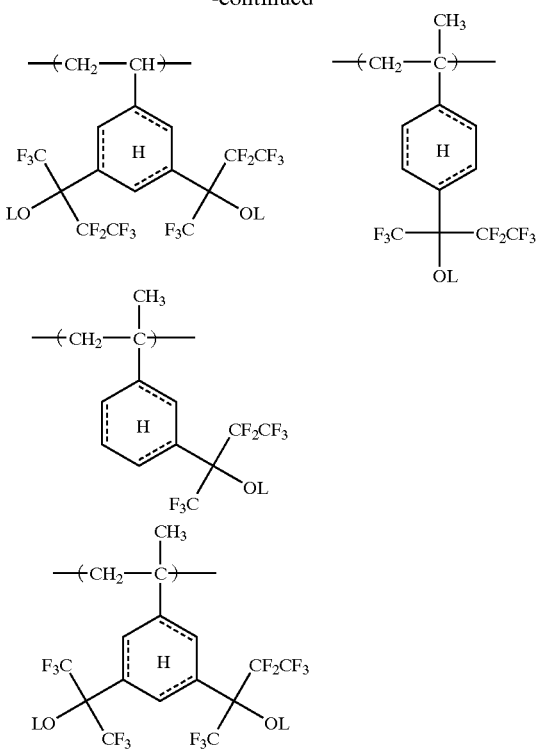

The group decomposable upon the action of an acid (hereinafter also referred to as an acid-decomposable group) represented by L includes, for example, —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$) and —C($R_{01}$)($R_{02}$)COO—C($R_{36}$)($R_{37}$)($R_{38}$).

$R_{36}$ to $R_{39}$ each independently represent an alkyl group which may have a substituent, a cycloalkyl group which may have a substituent, an alkenyl group which may have a substituent, an aralkyl group which may have a substituent or an aryl group which may have a substituent. Alternatively, $R_{36}$ and $R_{39}$ may be connected with each other to from a ring.

$R_{01}$ and $R_{02}$ each independently represent a hydrogen atom, an alkyl group which may have a substituent, a cycloalkyl group which may have a substituent, an alkenyl group which may have a substituent, an aralkyl group which may have a substituent or an aryl group which may have a substituent.

The alkyl group represented by any one of $R_{36}$ to $R_{39}$, $R_{01}$ and $R_{02}$ is preferably an alkyl group having from 1 to 8 carbon atoms and includes, for example, methyl, ethyl, propyl, n-butyl, sec-butyl, hexyl, 2-ethylhexyl and octyl groups.

The cycloalkyl group represented by any one of $R_{36}$ to $R_{39}$, $R_{01}$ and $R_{02}$ may be a monocyclic type or a polycyclic type. The monocyclic type is preferably a cycloalkyl group having from 3 to 8 carbon atoms and includes, for example, cyclopropyl, cyclopentyl, cyclohexyl, cycloheptyl and cyclooctyl groups. The polycyclic type is preferably a cycloalkyl group having from 6 to 20 carbon atoms and includes, for example, adamantyl, norbornyl, isobornyl, camphanyl, dicyclopentyl, α-pinenyl, tricyclodecanyl, tetracyclododecyl and androstanyl groups. The carbon atoms in the monocyclic or polycyclic cycloalkyl group may be partially replaced by a hetero atom, for example, an oxygen atom.

The aryl group represented by any one of $R_{36}$ to $R_{39}$, $R_{01}$ and $R_{02}$ is preferably an aryl group having from 6 to 10 carbon atoms and includes, for example, phenyl, tolyl, dimethylphenyl, 2,4,6-trimethylphenyl, naphthyl, anthryl and 9,10-dimethoxyanthryl groups.

The aralkyl group represented by any one of $R_{36}$ to $R_{39}$, $R_{01}$ and $R_{02}$ is preferably an aralkyl group having from 7 to 12 carbon atoms and includes, for example, benzyl, phenethyl and naphthylmethyl groups.

The alkenyl group represented by any one of $R_{36}$ to $R_{39}$, $R_{01}$ and $R_{02}$ is preferably an alkenyl group having from 2 to 8 carbon atoms and includes, for example, vinyl, allyl, butenyl and cyclohexenyl groups.

The substituent for the groups represented by $R_{36}$ to $R_{39}$, $R_{01}$ and $R_{02}$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Specific preferred examples of the acid-decomposable group include a tertiary alkyl group, e.g., tert-butyl, tert-amyl, 1-alkyl-1-cyclohexyl, 2-alkyl-2-adamantyl, 2-adamantyl-2-propyl or 2-(4-methylcyclohexyl)-2-propyl group, an acetal group, e.g., 1-alkoxy-1-ethoxy, 1-alkoxy-1-methoxy or tetrahydropyranyl group, a tert-alkyloxycarbonyl group, an ethoxymethyl group, a methoxyethoxymethyl group and a tert-alkylcarbonylmethyl group.

The acid-decomposable group may be present as L in the repeating unit represented by formula (Y) or may be present in other repeating unit that may be incorporated into the resin of Component (A), if desired.

The resin of Component (A) may have a repeating unit derived from other copolymerizable monomer as well as the above-described repeating unit.

The copolymerizable monomer, which can be used, includes, for example, an acrylate, an acrylamide, a methacrylate, a methacrylamide, an allyl compound, a vinyl ether, a vinyl ester, a styrene, a crotonate, a dialkyl ester of maleic acid or fumaric acid, maleic anhydride, maleimide, acrylonitrile, methacrylonitrile and maleonitrile. Copolymers including an acrylonitrile or methacrylonitrile unit are effective for improving transparency and adhesion to a substrate and particularly preferred. In addition, addition polymerizable unsaturated compounds copolymerizable with a monomer corresponding to the repeating unit represented by formula (Y) may be ordinarily used.

The repeating structural units shown in the above-described specific examples may be used individually or as a mixture of two or more thereof.

The resin of Component (A) can be obtained by polymerizing a monomer having a styryl carbon-carbon double bond according to a radical polymerization method and then hydrogenating the benzene nucleus. Although various methods as described in *Shin-Jikken Kagaku Koza: Sanka to Kangen* (*New Course of Experimental Chemistry: Oxidation and Reduction*), Vol. II, Maruzen Co., Ltd. can be employed for the hydrogenation, a method of hydrogenation by means of a hydrogen gas under a normal pressure or pressurized condition using a catalyst, for example, rhodium, ruthenium or platinum is easily used.

A weight average molecular weight of the resin of Component (A) is preferably in a range of from 1,000 to 200,000, and more preferably in a range of from 3,000 to 20,000. Molecular weight distribution of the resin of Component (A) is ordinarily in a range of from 1 to 10, preferably in a range of from 1 to 3, and more preferably in a range of from 1 to 2. As the molecular weight distribution of the resin used is small, the resulting resist composition is more excellent in the resolution, resist shape, sidewall smoothness of resist pattern and line edge roughness.

Specific examples of the resin of Component (A) are set forth below, but the present invention should not be construed as being limited thereto.

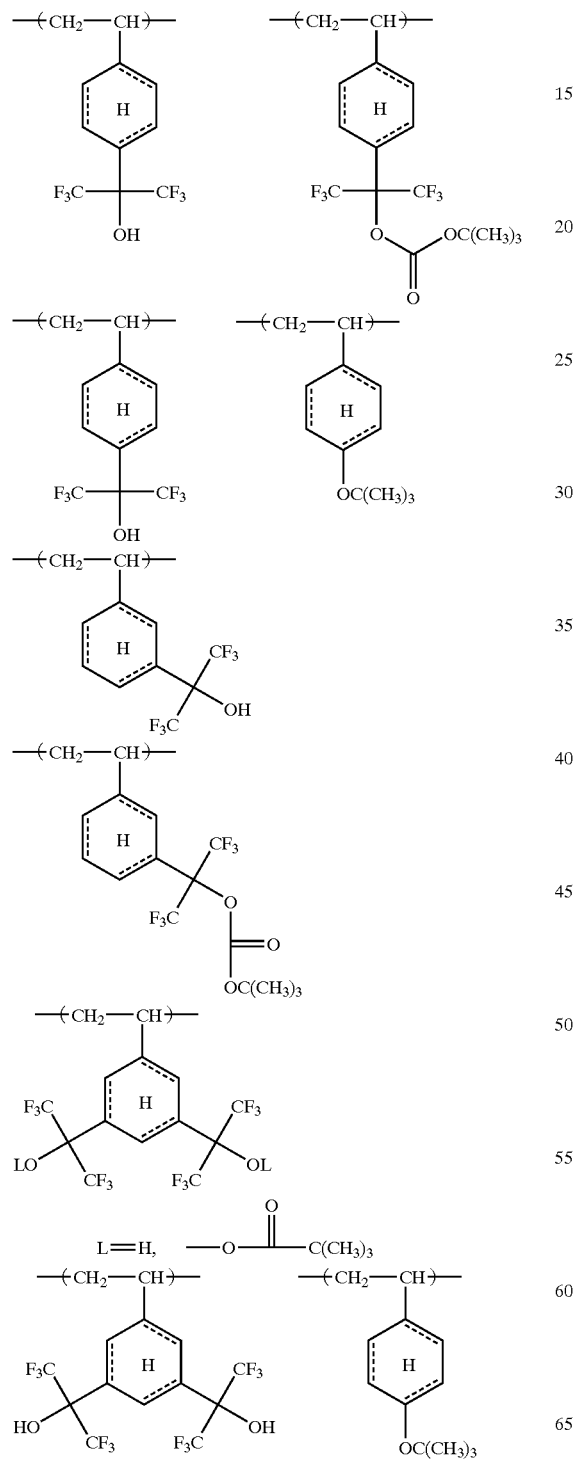

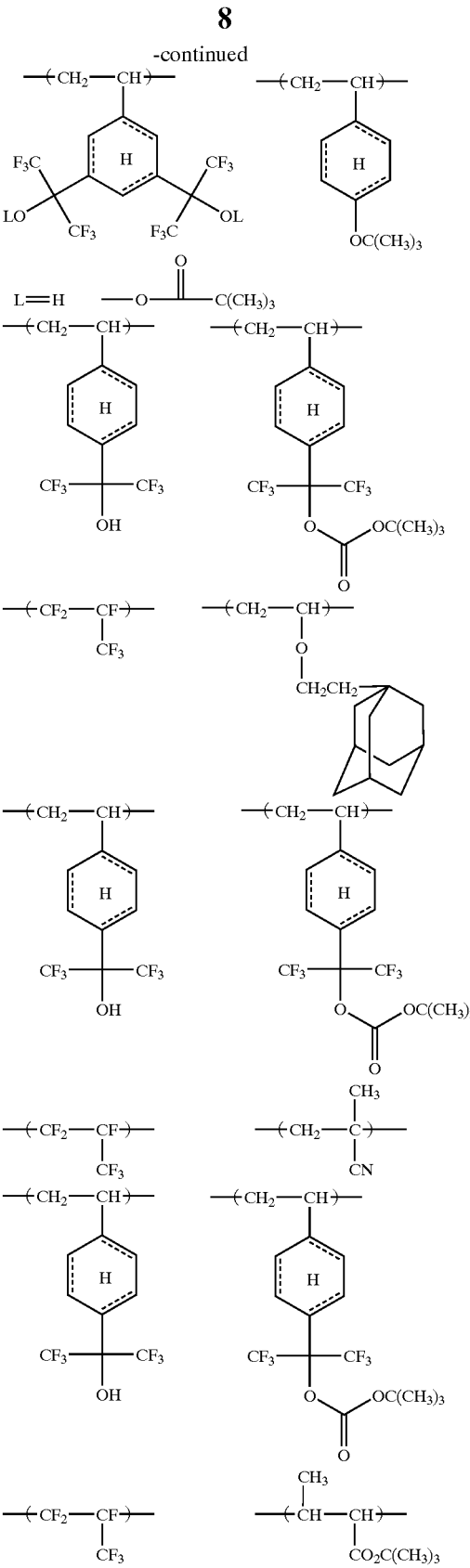

The amount of the resin of Component (A) used in the positive resist composition of the present invention is ordinarily from 50 to 99.5% by weight, preferably from 80 to 99% by weight, and more preferably from 90 to 98% by weight, based on the total solid content of the resist composition.

[2] Compound Capable of Generating an Acid Upon Irradiation of an Actinic Ray or Radiation (Component (B))

The positive resist composition of the present invention contains a compound that is capable of generating an acid upon irradiation of an actinic ray or radiation, particularly an F2 excimer laser beam.

The compound capable of generating an acid upon irradiation of an actinic ray or radiation for use in the present invention can be ordinarily selected from compounds used as compounds (photo-acid generators) that are decomposed by irradiation of an actinic ray or radiation to generate an acid.

Specifically, the compound can be appropriately selected from photoinitiators for photo-cationic polymerization, photoinitiators for photo-radical polymerization, photoachromatic agents for dyes, photo-discoloring agents, compounds capable of generating an acid with known light used for microresists (for example, an ultraviolet ray having a wavelength of from 400 to 200 or a far ultraviolet ray, particularly preferably g-line, h-line, i-line or a KrF excimer laser beam), an ArF excimer laser beam, an F2 excimer laser beam, an electron beam, an X ray, a molecular beam or an ion beam, and mixtures thereof.

Specific examples of such compounds include diazonium salts as described, e.g., in S. I. Schlesinger, *Photogr. Sci. Eng.*, 18, 387 (1974) and T. S. Bal et al., *Polymer*, 21, 423 (1980); onium salts, for example, ammonium salts as described, e.g., in U.S. Pat. Nos. 4,069,055, 4,069,056 and Re 27,992 and JP-A-3-140140, phosphonium salts as described, e.g., in D. C. Necker et al., *Macromolecules*, 17, 2468 (1984), C. S. Wen et al., *Teh. Proc. Conf. Rad. Curing ASIA*, p. 478, Tokyo (October 1988) and U.S. Pat. Nos. 4,069,055 and 4,069,056, iodonium salts as described, e.g., in J. V. Crivello et al., *Macromolecules*, 10(6), 1307(1977), *Chem. & Eng. News*, November 28, p. 31 (1988), European Patents 104,143, 339,049 and 410,201, JP-A-2-150848 and JP-A-2-296514, sulfonium salts as described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents 370,693, 161,811, 410,201, 339,049, 233,567, 297,443 and 297,442, U.S. Pat. Nos. 4,933,377, 3,902,114, 4,760,013, 4,734,444 and 2,883,827, German Patents 2,904, 626, 3,604,580 and 3,604,581, selenonium salts as described, e.g., in J. V. Crivello et al., *Macromolecules*, 10(6), 1307 (1977) and J. V. Crivello et al., *J. Polymer Sci.*, Polymer Chem. Ed., 17, 1047 (1979), and arsonium salts as described, e.g., in C. S. Wen et al., *Teh. Proc. Conf. Rad. Curing ASIA*, p. 478, Tokyo (October 1988); organic halogen compounds as described, e.g., in U.S. Pat. No. 3,905, 815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halogen compounds as described, e.g., in K. Meier et al., *J. Rad. Curing*, 13(4), 26(1986), T. P. Gill et al., *Inorg. Chem.*, 19, 3007 (1980), D. Astruc, *Acc. Chem. Res.*, 19(12), 377 (1986) and JP-A-2-161445; photo-acid generators having an O-nitrobenzyl type protective group as described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022; compounds generating a sulfonic acid upon photolysis, as typified by iminosulfonates, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 199,672, 084,515, 044,115, 618,564 and 101,122, U.S. Pat. Nos. 4,371,605 and 4,431,774, JP-A-64-18143, JP-A-2-245756 and JP-A-3-140109; and disulfone compounds as described, e.g., in JP-A-61-166544.

Of the compounds capable of generating an acid upon irradiation of an actinic ray or radiation, a compound capable of generating an organic sulfonic acid upon irradiation of an actinic ray or radiation of (B1) is preferably used in the present invention.

The compound capable of generating an organic sulfonic acid upon irradiation of an actinic ray or radiation of (B1) includes (B1a) a compound capable of generating a sulfonic acid containing a fluorine atom upon irradiation of an actinic ray or radiation and (B1b) a compound capable of generating a sulfonic acid free from a fluorine atom upon irradiation of an actinic ray or radiation.

(B1a) Compound Capable of Generating a Sulfonic Acid Containing a Fluorine Atom upon Irradiation of an Actinic Ray or Radiation:

The compound capable of generating a sulfonic acid containing a fluorine atom upon irradiation of an actinic ray includes, for example, an iodonium salt represented by formula (PAG3) shown below and a sulfonium salt represented by formula (PAG4) shown below.

In formulae (PAG3) and (PAG4), $Ar^1$ and $Ar^2$ each independently represent a substituted or unsubstituted aryl group. $R^{203}$, $R^{204}$ and $R^{205}$ each independently represent a substituted or unsubstituted alkyl group or a substituted or unsubstituted aryl group.

$Z^-$ represents an anion of sulfonic acid having at least one fluorine atom.

Alternatively, two of $R^{203}$, $R^{204}$ and $R^{205}$, or $Ar^1$ and $Ar^2$ may be combined with each other through a single bond or a substituent.

The aryl group represented by $Ar^1$, $Ar^2$, $R^{203}$, $R^{204}$ or $R^{205}$ is preferably an aryl group having from 6 to 14 carbon atoms. The alkyl group represented by $Ar^1$, $Ar^2$, $R^{203}$, $R^{204}$ or $R^{205}$ is preferably an alkyl group having 1 to 8 carbon atoms.

Preferred examples of the substituent for the aryl group include an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxy group, a hydroxy group, a halogen atom and a phenylthio group. Preferred examples of the substituent for the alkyl group include an alkoxy group having from 1 to 8 carbon atoms, an aryl group having from 5 to 14 carbon atoms, an arylcarbonyl group having from 6 to 15 carbon atoms, a carboxy group and a halogen atom.

The anion of sulfonic acid represented by $Z^-$ includes preferably an anion of sulfonic acid containing an aliphatic hydrocarbon group having from 1 to 20 carbon atoms or an aromatic hydrocarbon group having from 5 to 20 carbon atoms. The hydrocarbon group may have a substituent. Examples of the substituent include an alkoxy group having from 1 to 10 carbon atoms, which may be substituted with a fluorine atom, an alkoxycarbonyl group having from 2 to 11 carbon atoms, which may be substituted with a fluorine atom, a phenylamino group, a phenylcarbonyl group, a halogen atom and a hydroxy group. The substituent for the aromatic hydrocarbon group also includes an alkyl group having from 1 to 15 carbon atoms.

Of the aliphatic sulfonic acid anions, an anion of sulfonic acid having a fluorine atom on the α-carbon atom thereof has a high anionic strength and when the anion is used together with a sulfonic acid anion free from a fluorine atom, it tends to easily conduct salt exchange with the sulfonic acid anion free from a fluorine atom. The perfluoro aliphatic sulfonic acid anion has a higher anionic strength.

Specific examples of such compounds are set forth below, but the present invention should not be construed as being limited thereto.

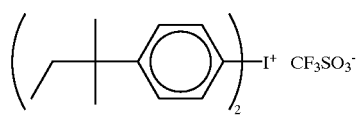
(VI-1)

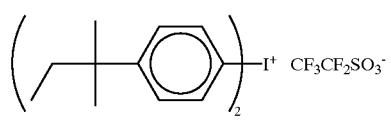
(VI-2)

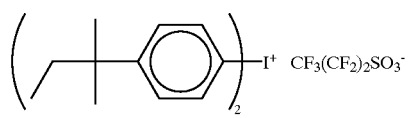
(VI-3)

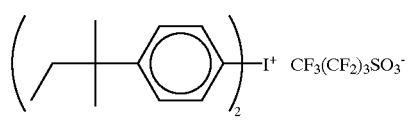
(VI-4)

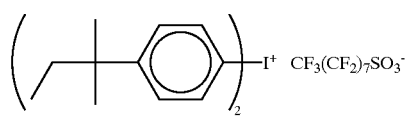
(VI-5)

-continued

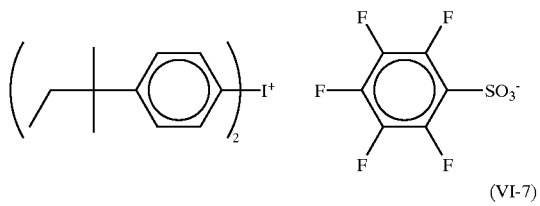
(VI-6)

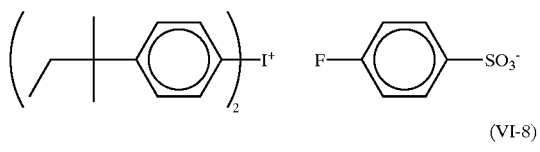
(VI-7)

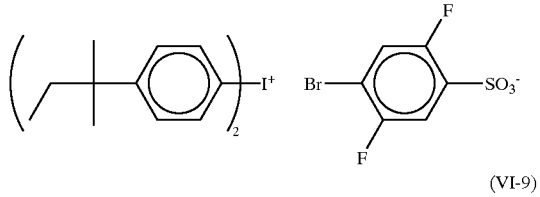
(VI-8)

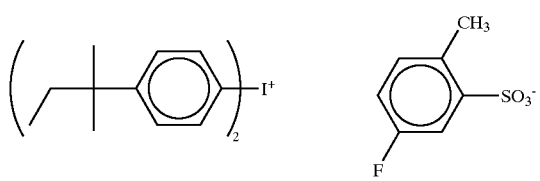
(VI-9)

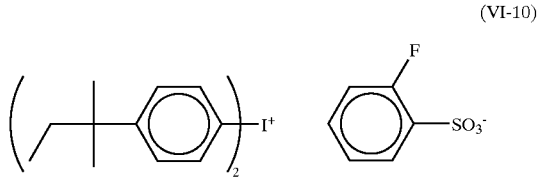
(VI-10)

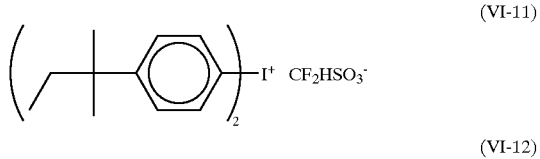
(VI-11)

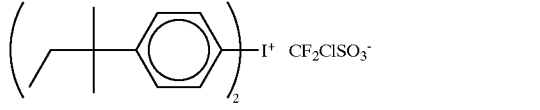
(VI-12)

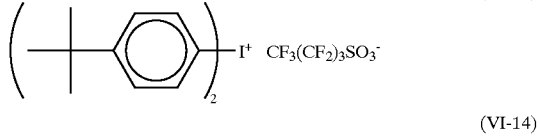
(VI-13)

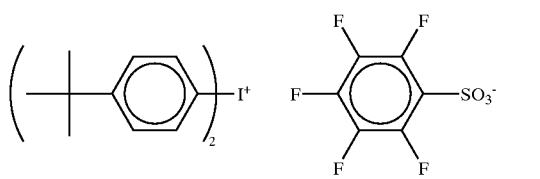
(VI-14)

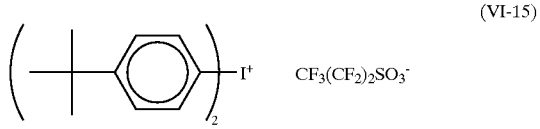
(VI-15)

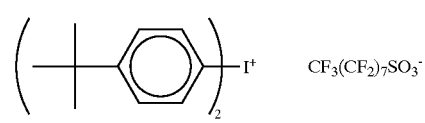 (VI-16)
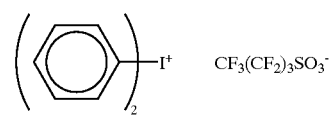 (VI-17)
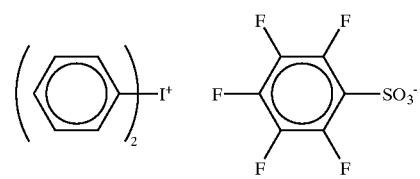 (VI-18)
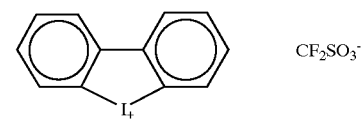 (VI-19)
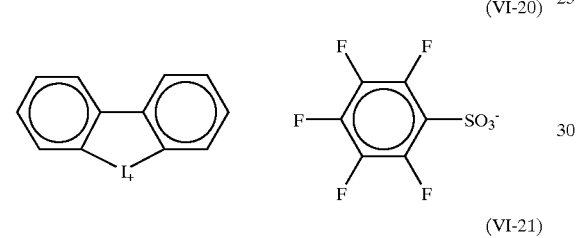 (VI-20)
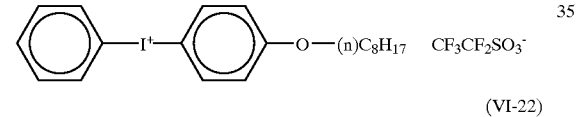 (VI-21)
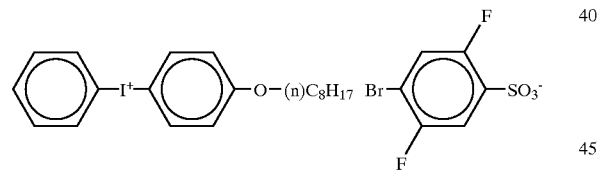 (VI-22)
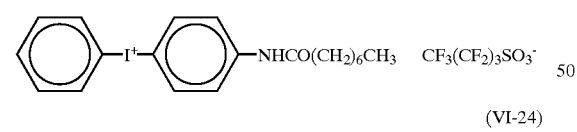 (VI-23)
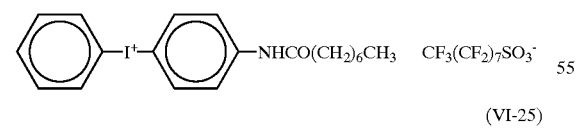 (VI-24)
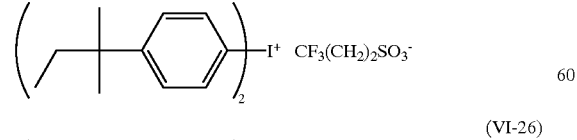 (VI-25)
(VI-26)
 (VI-27)
 (VI-28)
 (VI-29)
 (VI-30)
 (VI-31)
 (VI-32)
 (VII-1)
 (VII-2)
 (VII-3)
 (VII-4)
 (VII-5)
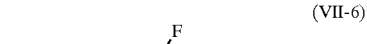 (VII-6)

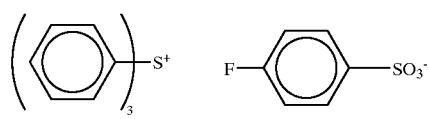 (VII-7)
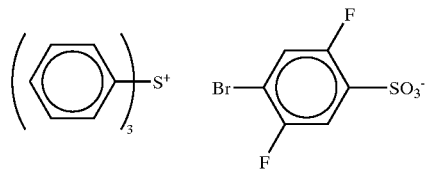 (VII-8)
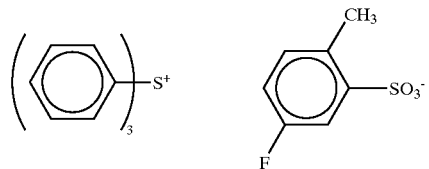 (VII-9)
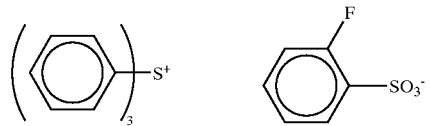 (VII-10)
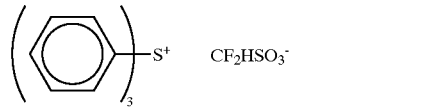 (VII-11)
 (VII-12)
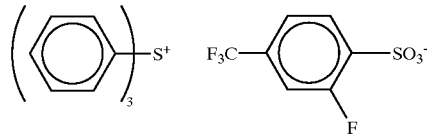 (VII-13)
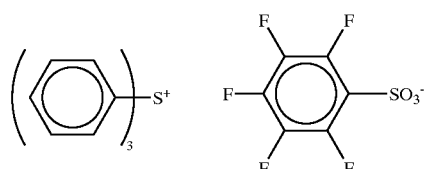 (VII-14)
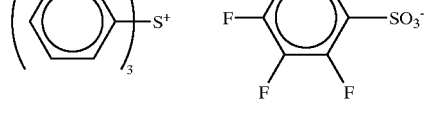 (VII-15)
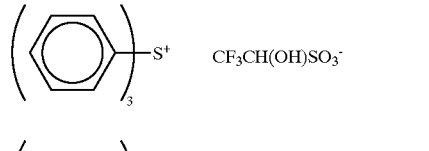 (VII-16)
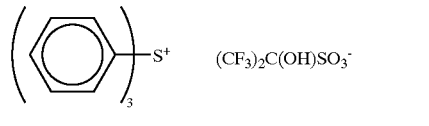 (VII-17)
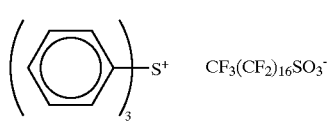 (VII-18)
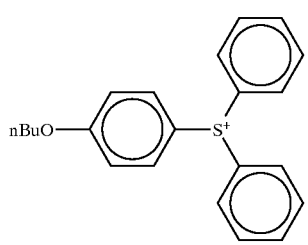 (VII-19)
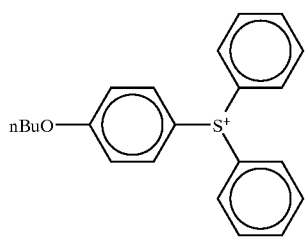 (VII-20)
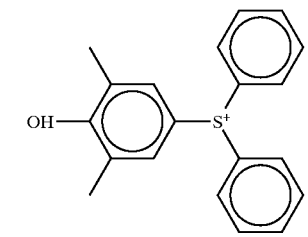 (VII-21)
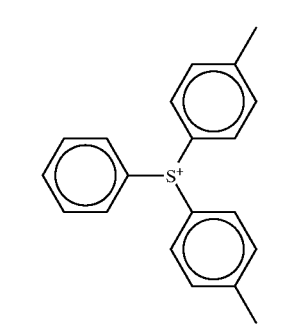 (VII-22)
(VII-23)

(VII-24)
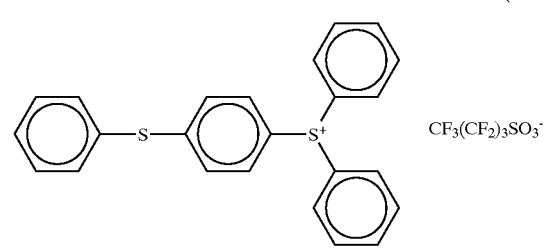
CF₃(CF₂)₃SO₃⁻
(VII-25)
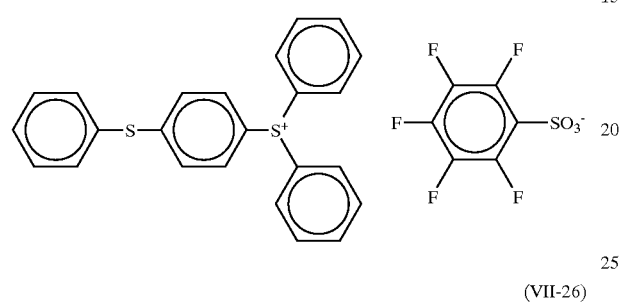
(VII-26)
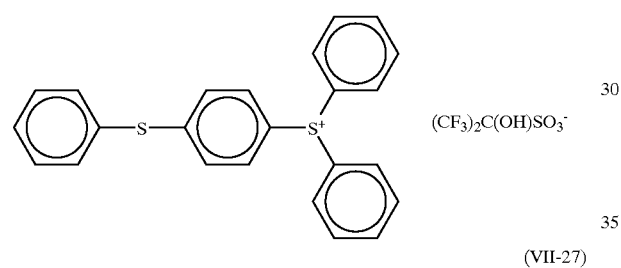
(CF₃)₂C(OH)SO₃⁻
(VII-27)
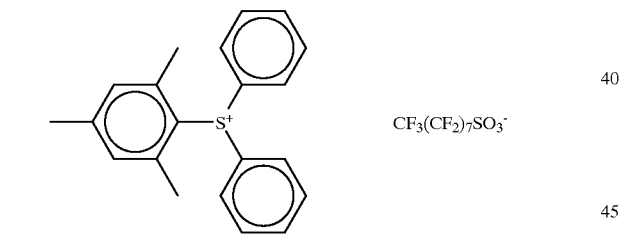
CF₃(CF₂)₇SO₃⁻
(VII-28)
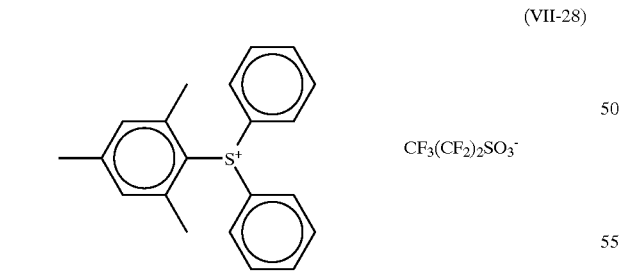
CF₃(CF₂)₂SO₃⁻
(VII-29)
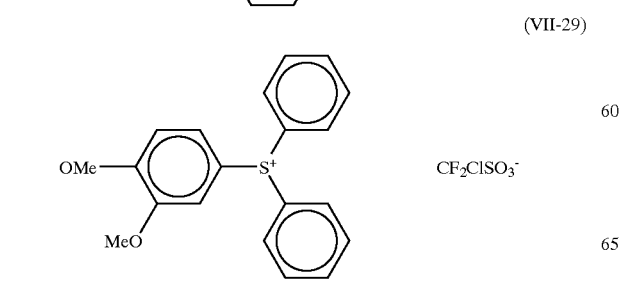
CF₂ClSO₃⁻
(VII-30)
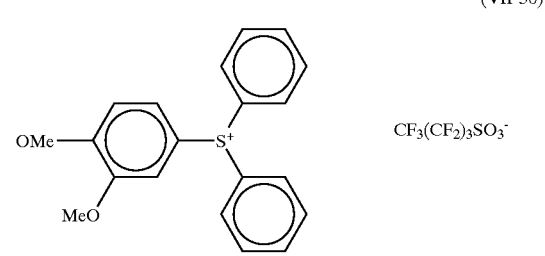
CF₃(CF₂)₃SO₃⁻
(VII-31)
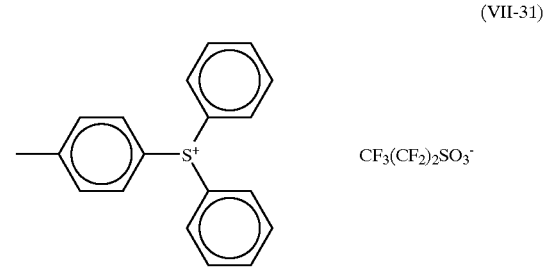
CF₃(CF₂)₂SO₃⁻
(VII-32)
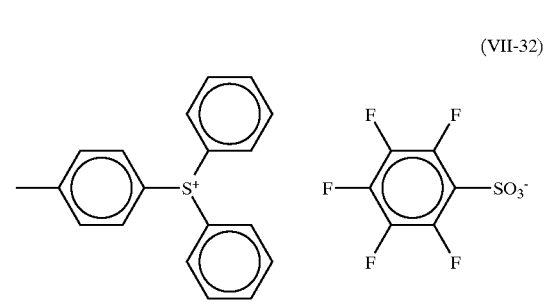
(VII-33)
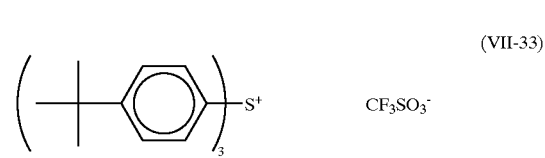
CF₃SO₃⁻
(VII-34)
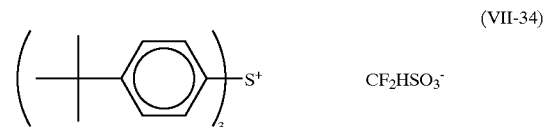
CF₂HSO₃⁻
(VII-35)
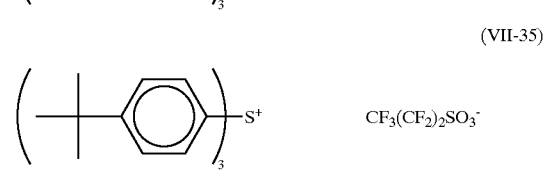
CF₃(CF₂)₂SO₃⁻
(VII-36)
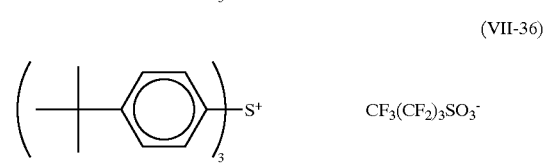
CF₃(CF₂)₃SO₃⁻
(VII-37)
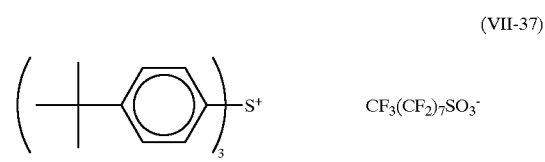
CF₃(CF₂)₇SO₃⁻

(VII-38) 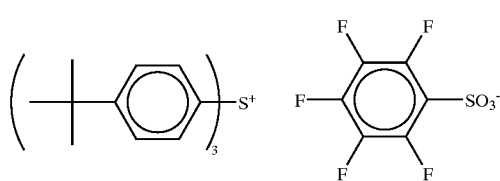 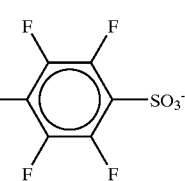
(VII-39) 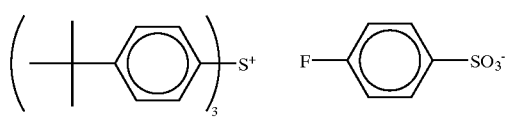 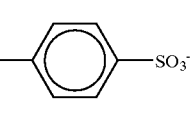
(VII-40) 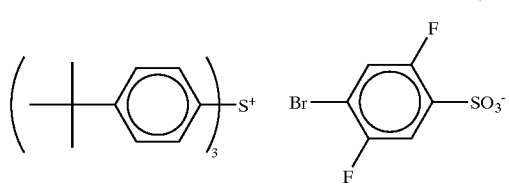 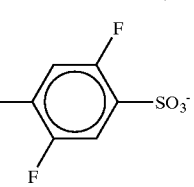
(VII-41) 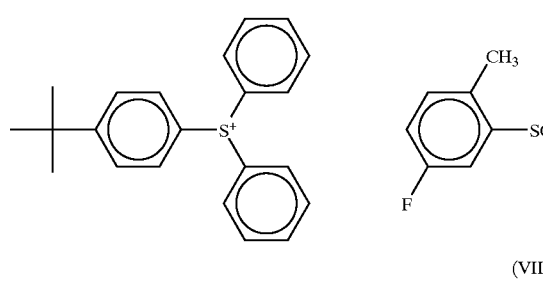 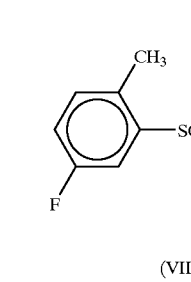
(VII-42) 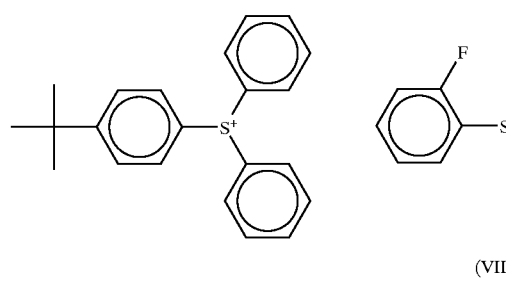 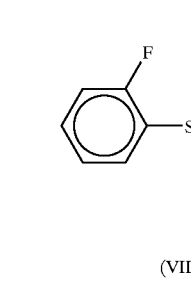
(VII-43) 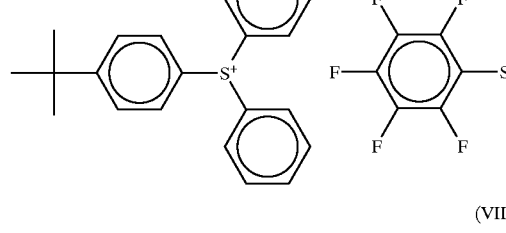 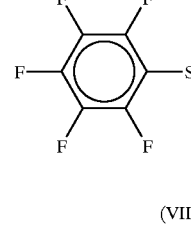
(VII-44) 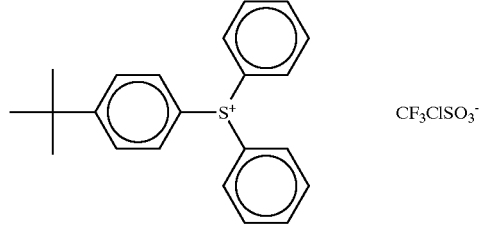 CF$_3$ClSO$_3^-$
(VII-45) 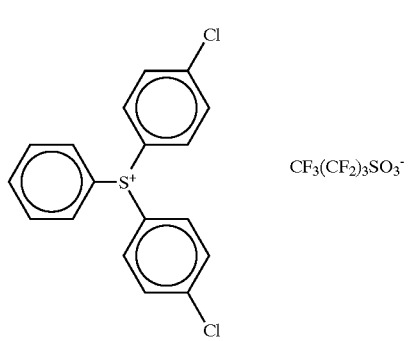 CF$_3$(CF$_2$)$_3$SO$_3^-$
(VII-46) 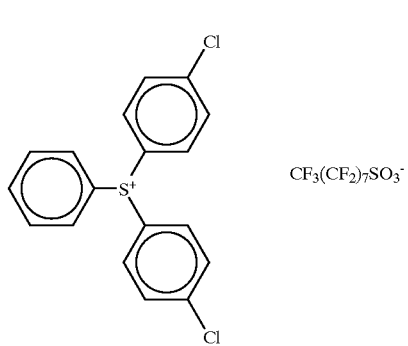 CF$_3$(CF$_2$)$_7$SO$_3^-$
(VII-47) 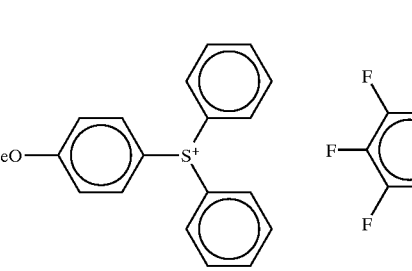
(VII-48) 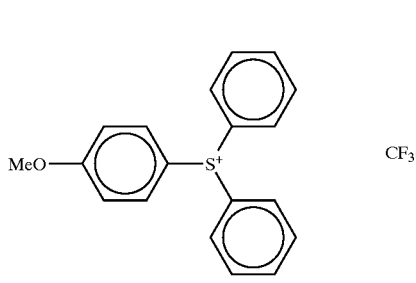 CF$_3$(CF$_2$)$_2$SO$_3^-$
(VII-49) 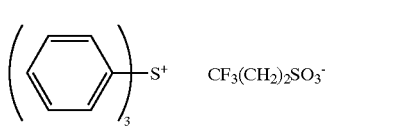 CF$_3$(CH$_2$)$_2$SO$_3^-$
(VII-50) 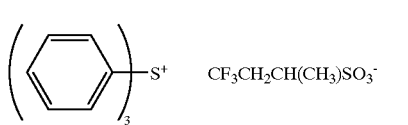 CF$_3$CH$_2$CH(CH$_3$)SO$_3^-$
(VII-51) 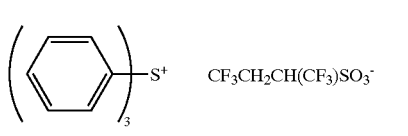 CF$_3$CH$_2$CH(CF$_3$)SO$_3^-$

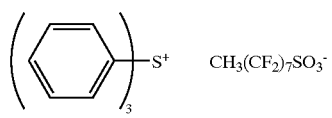 (VII-52)

 (VII-56)

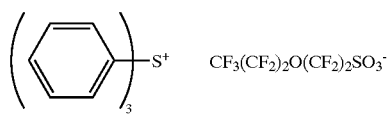 (VII-53)

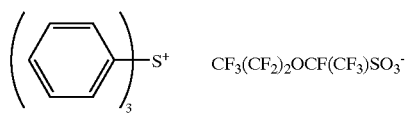 (VII-54)

(B1b) Compound Capable of Generating a Sulfonic Acid Free from a Fluorine Atom upon Irradiation of an Actinic Ray or Radiation:

The compound capable of generating a sulfonic acid free from a fluorine atom upon irradiation of an actinic ray includes, for example, an iodonium salt represented by formula (PAG3) shown above and a sulfonium salt represented by formula (PAG4) shown above, wherein $Z^-$ represents an anion of sulfonic acid free from a fluorine atom.

 (VII-55)

Specific examples of such compounds are set forth below, but the present invention should not be construed as being limited thereto.

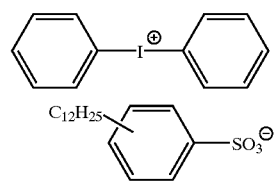 (PAG3-1)

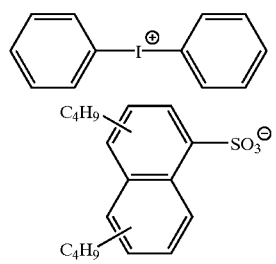 (PAG3-2)

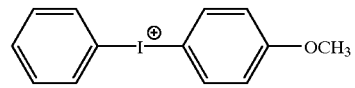 (PAG3-5)

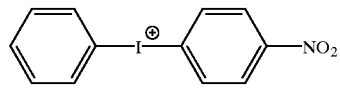 (PAG3-7)

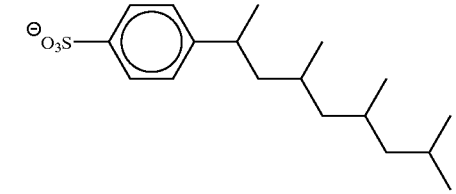

(PAG3-9)

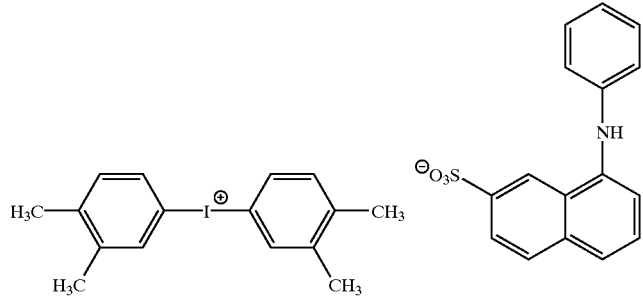

(PAG3-10)
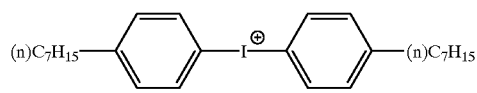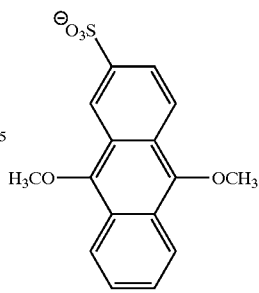
(PAG3-11)
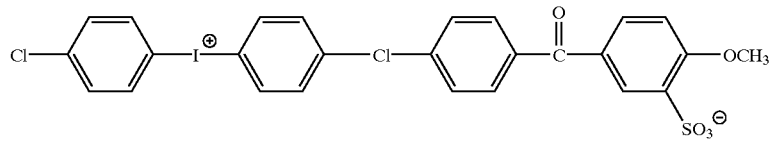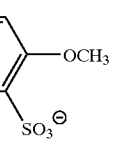
(PAG3-13)
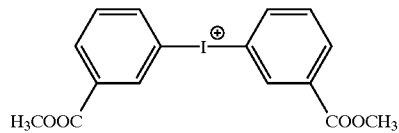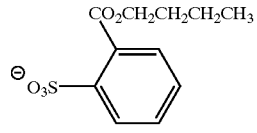
(PAG3-14)
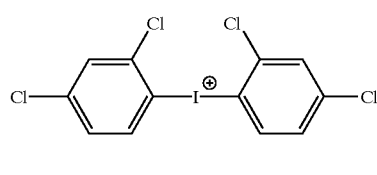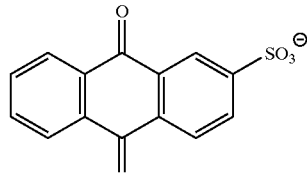
(PAG3-15)
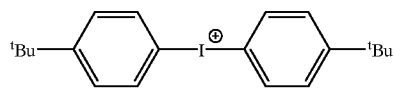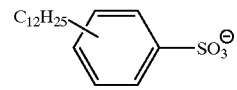
(PAG3-16)
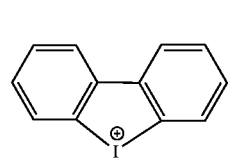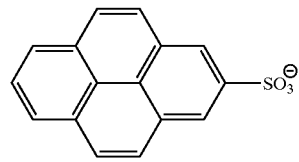
(PAG3-18)
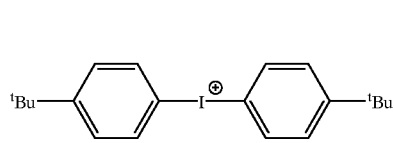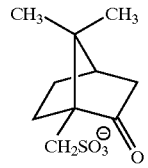
(PAG3-19)
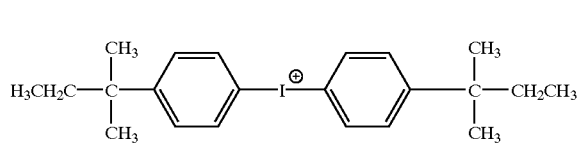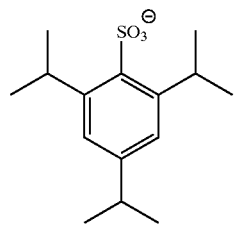

-continued
(PAG3-24)
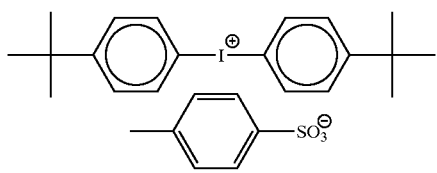
(PAG3-25)
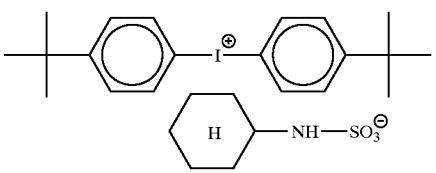
(PAG3-26)
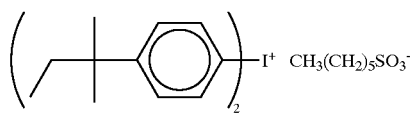
(PAG3-27)
(PAG3-28)
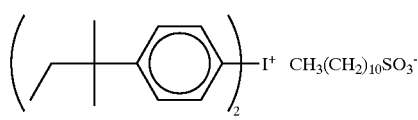
(PAG3-29)
(PAG3-30)
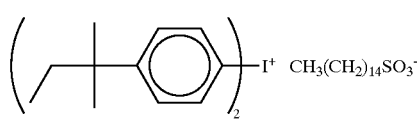
(PAG3-31)
(PAG4-1)
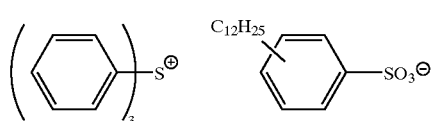
(PAG4-2)
(PAG4-4)
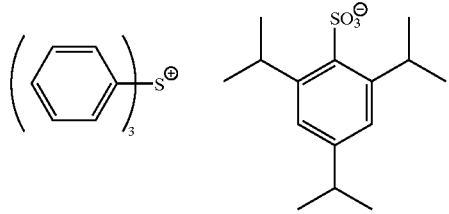
(PAG4-12)
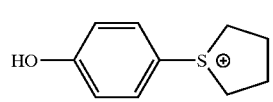
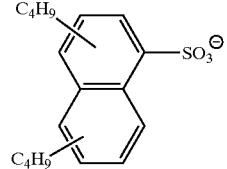
(PAG4-16)
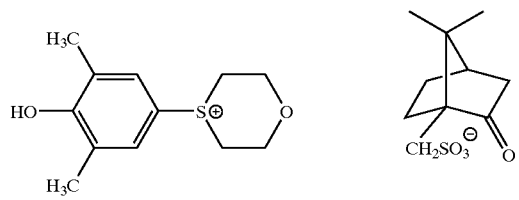
(PAG4-20)
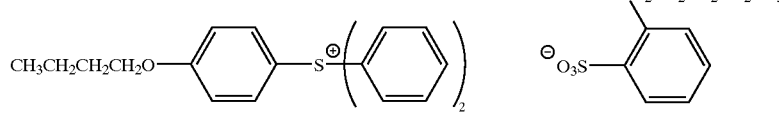
(PAG4-22)
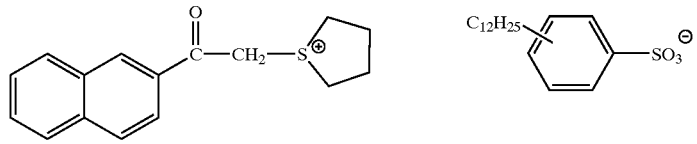
(PAG4-24)
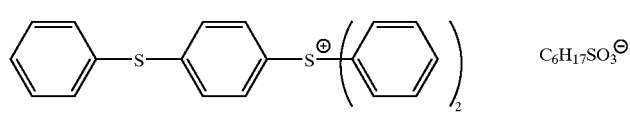  $C_6H_{17}SO_3^{\ominus}$ -continued
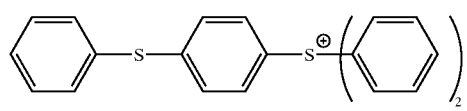 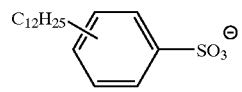
(PAG-27) (PAG4-25)
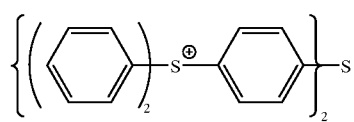 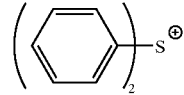
(PAG-28)
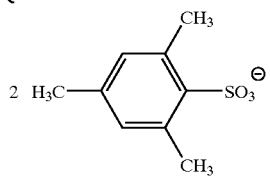 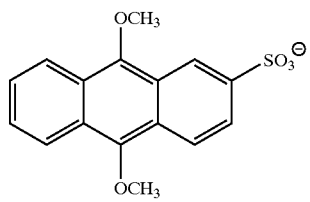
(PAG4-30)
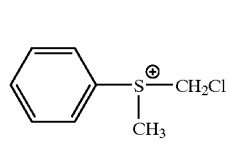
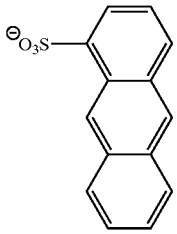
(PAG4-32) (PAG4-33)
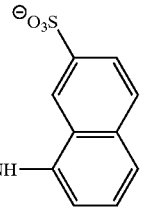 
CH₃(CH₂)₅SO₃⁻
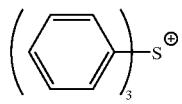
(PAG4-34) (PAG4-35)
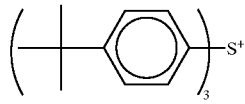 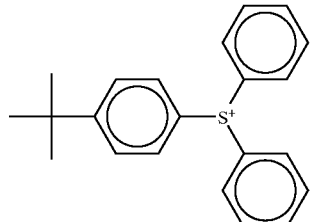
CH₃(CH₂)₇SO₃⁻
CH₃(CH₂)₁₀SO₃⁻
(PAG4-36) (PAG4-37)
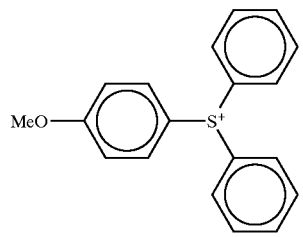 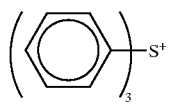
CH₃(CH₂)₁₄SO₃⁻
CH₃(CH₂)₁₂SO₃⁻
(PAG4-38) (PAG4-39)
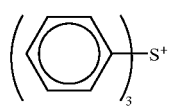 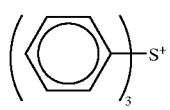
CH₃(CH₂)₁₈SO₃⁻ C₄H₅SO₃⁻

Further, a disulfone derivative represented by formula (PAG5) shown below and an iminosulfonate derivative represented by formula (PAG6) shown below are exemplified.

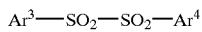
(PAG5)

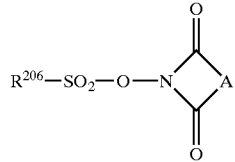
(PAG6)

In formulae (PAG5) and (PAG6), $Ar^3$ and $Ar^4$ each independently represent a substituted or unsubstituted aryl group. $R^{206}$ represents a substituted or unsubstituted alkyl group or a substituted or unsubstituted aryl group. A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

(PAG5-1)
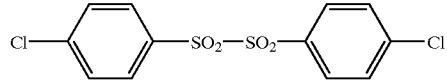

(PAG5-2)
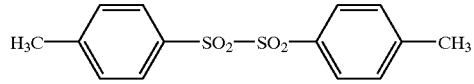

(PAG5-3)
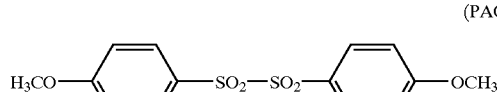

(PAG5-4)

(PAG5-6)
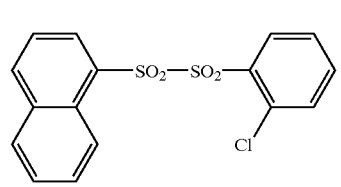

(PAG5-7)
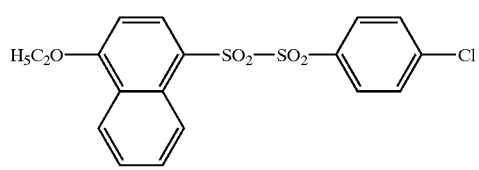

(PAG5-8)
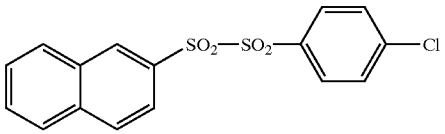

(PAG5-9)
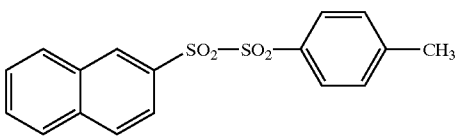

(PAG5-10)
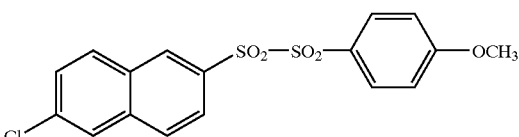

(PAG5-11)
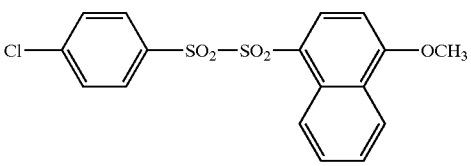

(PAG5-12)
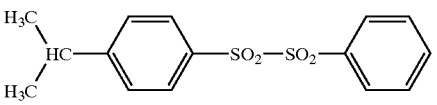

(PAG5-14)
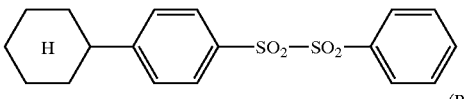

(PAG5-15)
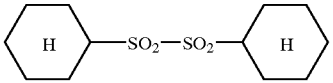

(PAG6-1)
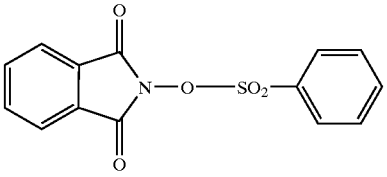

(PAG6-2)
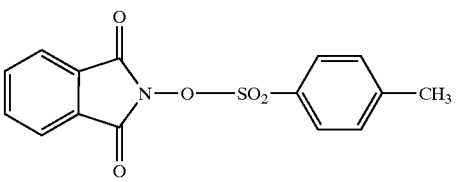

(PAG6-3)
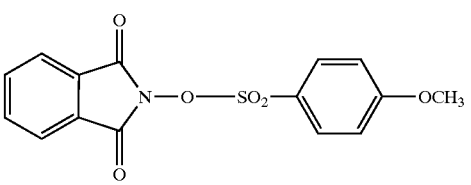

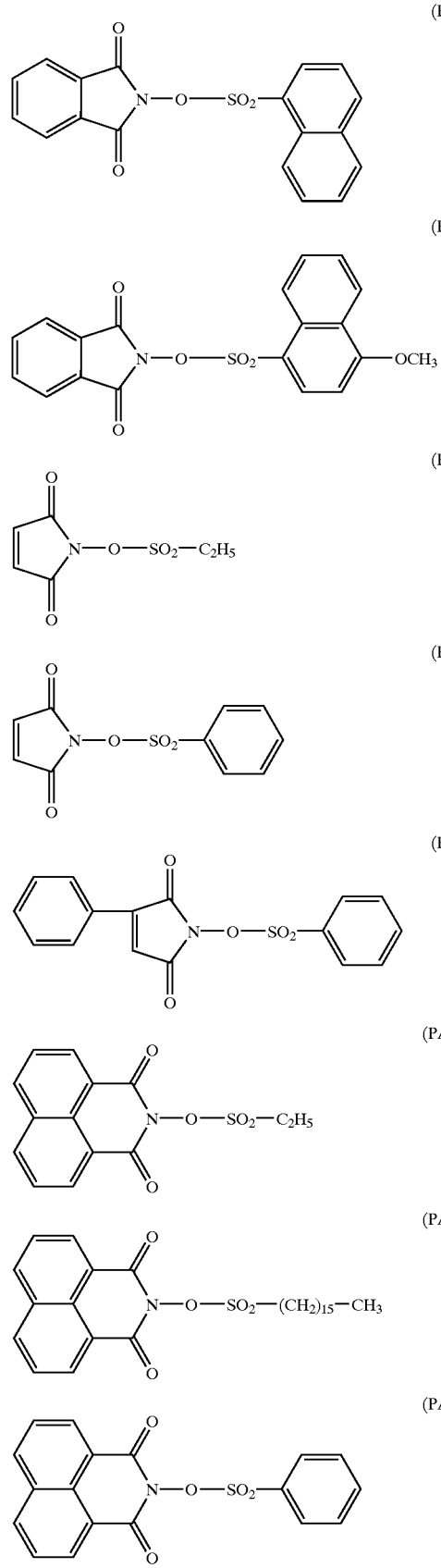

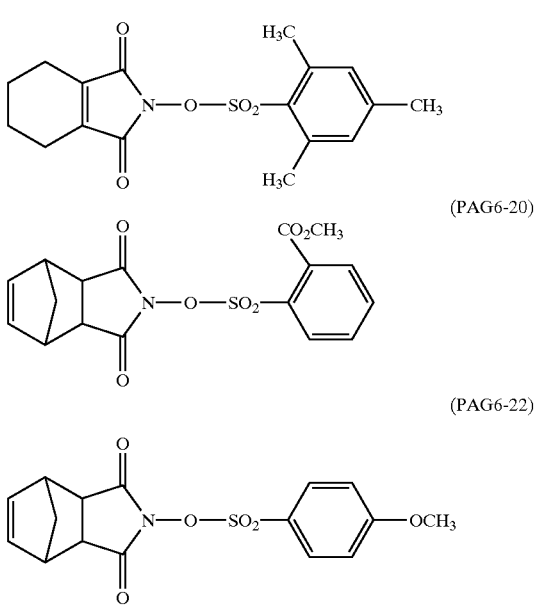

Moreover, a diazodisulfone derivative represented by formula (PAG7) shown below is also exemplified.

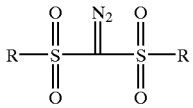

(PAG7)

In formula (PAG7), R represents a straight chain, branched or cyclic alkyl group or an aryl group which may have a substituent.

Specific examples of such compounds are set forth below, but the present invention should not be construed as being limited thereto.

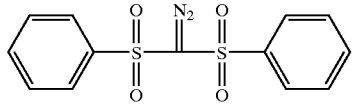

(PAG7-1)

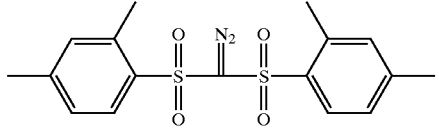

(PAG7-2)

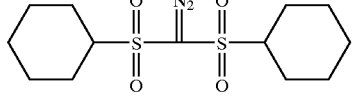

(PAG7-3)

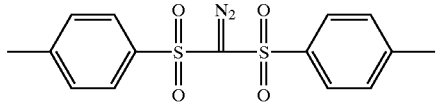

(PAG7-4)

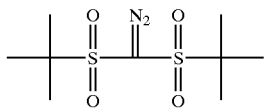
(PAG7-5)

The compound represented by any one of formulae (B1a) and (B1b) can be synthesized by reacting an aromatic compound with a periodate and subjecting the resulting iodonium salt to salt exchange with a corresponding sulfonic acid.

The compound can also be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding sulfonic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The salt exchange can be conducted by introducing once into a halide, followed by converting to a sulfonate using a silver reagent, e.g., silver oxide, or by using an ion exchange resin. For the salt exchange, a sulfonic acid or sulfate commercially available or obtained by hydrolysis of a commercially available sulfonic acid halide can be employed.

In the positive resist composition of the present invention, it is preferred that the compound capable of generating an organic sulfonic acid upon irradiation of an actinic ray or radiation of (B1) is used together with a compound capable of being decomposed upon irradiation of an actinic ray or radiation to generate a carboxylic acid of (B2).

The compound capable of being decomposed upon irradiation of an actinic ray or radiation to generate a carboxylic acid of (B2) includes (B2a) a compound capable of being decomposed upon irradiation of an actinic ray or radiation to generate a carboxylic acid containing a fluorine atom and (B2b) a compound capable of being decomposed upon irradiation of an actinic ray or radiation to generate a carboxylic acid free from a fluorine atom. (B2a) Compound capable of being decomposed upon irradiation of an actinic ray or radiation to generate a carboxylic acid containing a fluorine atom:

The carboxylic acid containing a fluorine atom includes, for example, a fluorine-substituted aliphatic carboxylic acid and a fluorine-substituted aromatic carboxylic acid.

The fluorine-substituted aliphatic carboxylic acid includes a fluorine-substituted compound of an aliphatic carboxylic acid, for example, acetic acid, propionic acid, n-butyric acid, isobutyric acid, valeric acid, trimethylacetic acid, caproic acid, heptanoic acid, caprylic acid, pelargonic acid, capric acid, lauric acid, myristic acid, palmitic acid, stearic acid, undecanoic acid or tridecanoic acid. The aliphatic carboxylic acid may have a hydroxy group, an alkoxy group or a halogen atom other than a fluorine atom as a substituent. The aliphatic carboxylic acid may contain in its alicyclic chain a connecting group, for example, an oxygen atom, a sulfur atom, a carbonyl group, an ester group or a sulfonyl group.

Preferred examples of the fluorine-substituted aliphatic carboxylic acid include those represented by the following formula:

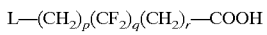

L—$(CH_2)_p(CF_2)_q(CH_2)_r$—COOH

In the formula, L represents a hydrogen atom or a fluorine atom, p and r each independently represent an integer of from 0 to 15, and q represents an integer of from 1 to 15. The hydrogen atom or fluorine atom included in the alkyl chain in the formula may be substituted with an alkyl group (preferably having from 1 to 5 carbon atoms) which may be substituted with a fluorine atom, an alkoxy group (preferably having from 1 to 5 carbon atoms) which may be substituted with a fluorine atom or a hydroxy group.

As the fluorine-substituted aliphatic carboxylic acid, a fluorine-substituted compound of a saturated aliphatic carboxylic acid having from 2 to 20 carbon atoms is preferred, and a fluorine-substituted compound of a saturated aliphatic carboxylic acid having from 4 to 20 carbon atoms is more preferred. By controlling the number of carbon atoms in the aliphatic carboxylic acid to 4 or more, diffusibility of the acid generated decreases, and fluctuation of line width with the lapse of time from exposure to post heating can be more restrained. Among them, a fluorine-substituted compound of a straight chain or branched saturated aliphatic carboxylic acid having from 4 to 18 carbon atoms is preferably used.

As the fluorine-substituted aromatic carboxylic acid, a fluorine-substituted compound of an aromatic carboxylic acid having from 7 to 20 carbon atoms is preferred, a fluorine-substituted compound of an aromatic carboxylic acid having from 7 to 15 carbon atoms is more preferred, and a fluorine-substituted compound of an aromatic carboxylic acid having from 7 to 11 carbon atoms is still more preferred. Specific examples of the fluorine-substituted aromatic carboxylic acid include a fluorine-substituted compound of an aromatic carboxylic acid, for example, benzoic acid, a substituted benzoic acid, naphthoic acid, a substituted naphthoic acid, anthracenecarboxylic acid or a substituted anthracenecarboxylic acid (wherein the substituent includes an alkyl group, an alkoxy group, a hydroxy group, a halogen atom, an aryl group, an acyl group, an acyloxy group, a nitro group, an alkylthio group and an arylthio group). Among them, a fluorine-substituted compound of benzoic acid or substituted benzoic acid is preferably used.

The aliphatic or aromatic carboxylic acid substituted with a fluorine atom includes an aliphatic or aromatic carboxylic acid in which at least one of the hydrogen atoms present in the skeleton other than the carboxy group is substituted with a fluorine atom. Particularly, an aliphatic or aromatic carboxylic acid in which all of the hydrogen atoms present in the skeleton other than the carboxy group are substituted with fluorine atoms (a perfluoro saturated aliphatic carboxylic acid or a perfluoro aromatic carboxylic acid) is preferred. By using such a perfluoro aliphatic or aromatic carboxylic acid, the sensitivity is more improved.

Of the aliphatic carboxylic acid anions, an anion of carboxylic acid having a fluorine atom on the α-carbon atom thereof has a high anionic strength and when the anion is used together with a carboxylic acid anion free from a fluorine atom, it tends to easily conduct salt exchange with a carboxylic acid anion free from a fluorine atom. The perfluoro aliphatic carboxylic acid anion has a higher anionic strength.

Of the compounds capable of being decomposed upon irradiation of an actinic ray or radiation to generate a carboxylic acid containing a fluorine atom, an onium salt compound (e.g., a sulfonium salt or an iodonium salt) having as a counter anion, the anion of aliphatic or aromatic carboxylic acid substituted with a fluorine atom described above, an imidocarboxylate compound having a carboxylic acid ester group and a nitrobenzyl ester compound having a carboxylic acid ester group are preferred.

More preferred examples of the compound capable of being decomposed upon irradiation of an actinic ray or radiation to generate a carboxylic acid containing a fluorine atom include compounds represented by formulae (I) to (III) shown below.

By using such a compound, the sensitivity, resolution and exposure margin are more improved. When the compound is irradiated with an actinic ray or radiation, it generates a saturated aliphatic or aromatic carboxylic acid substituted with at least one fluorine atom, which corresponds to an anion represented by $X^-$ in any one of formulae (I) to (III).

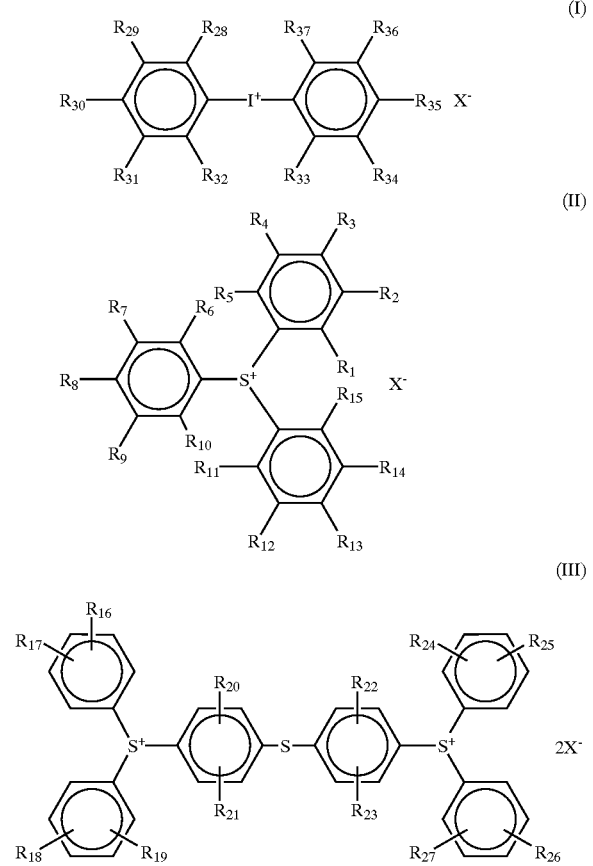

In formulae (I) to (III), $R_1$ to $R_{37}$ each independently represent a hydrogen atom, a straight chain, branched or cyclic alkyl group, a straight chain, branched or cyclic alkoxy group, a hydroxy group, a halogen atom or a group of —S—$R_{38}$. $R_{38}$ represents a straight chain, branched or cyclic alkyl group or an aryl group. $X^-$ represents an anion of an aliphatic or aromatic carboxylic acid substituted with at least one fluorine atom.

In any one of formulae (I) to (III), $X^-$ represents preferably an anion of a perfluoro aliphatic carboxylic acid or a perfluoro aromatic carboxylic acid, and more preferably an anion of a fluorine-substituted alkylcarboxylic acid having not less than 4 carbon atoms.

The straight chain or branched alkyl group represented by any one of $R_1$ to $R_{38}$ includes that having from 1 to 4 carbon atoms, which may have a substituent, for example, methyl, ethyl, propyl, n-butyl, sec-butyl or tert-butyl group. The cyclic alkyl group represented by any one of $R_1$ to $R_{38}$ includes that having from 3 to 8 carbon atoms, which may have a substituent, for example, cyclopropyl, cyclopentyl or cyclohexyl group.

The alkoxy group represented by any one of $R_1$ to $R_{37}$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_1$ to $R_{37}$ includes, for example, fluorine, chlorine, bromine and iodine atoms.

The aryl group represented by $R_{38}$ includes that having from 6 to 14 carbon atoms, which may have a substituent, for example, phenyl, tolyl, methoxyphenyl or naphthyl group.

The substituents for the above groups preferably include, for example, an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The iodonium compound or sulfonium compound represented by any one of formulae (I) to (III) for use in the present invention has as the counter anion represented by $X^-$, the anion of a saturated aliphatic or aromatic carboxylic acid substituted with at least one fluorine atom. The anion is an anion (—COO$^-$) formed by releasing the hydrogen atom of the saturated aliphatic or aromatic carboxylic acid (—COOH).

Specific examples of such compounds are set forth below, but the present invention should not be construed as being limited thereto.

Specific examples (I-1f) to (I-36f) of the compound represented by formula (I):

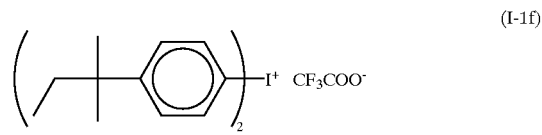

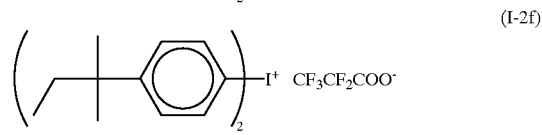

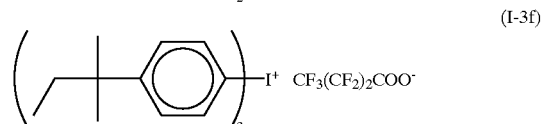

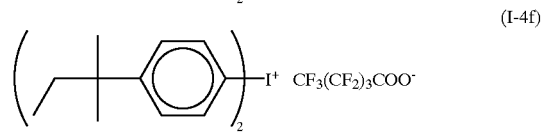

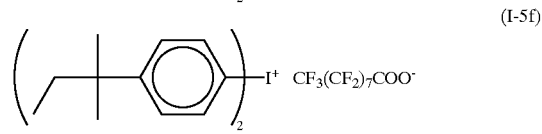

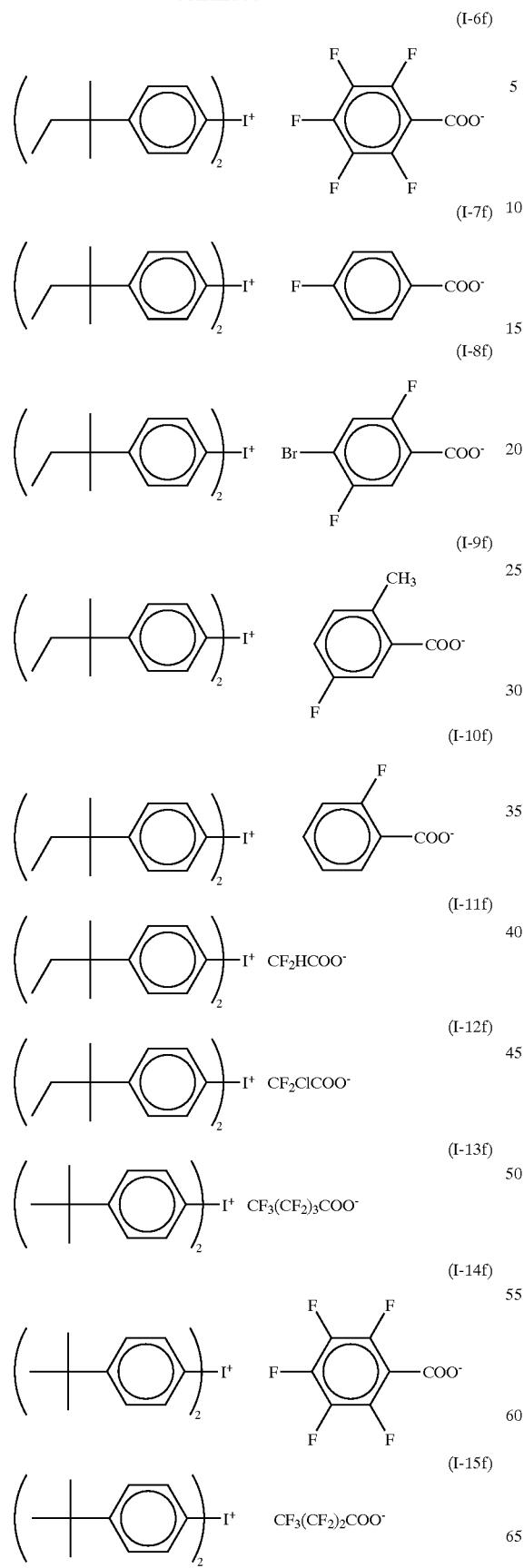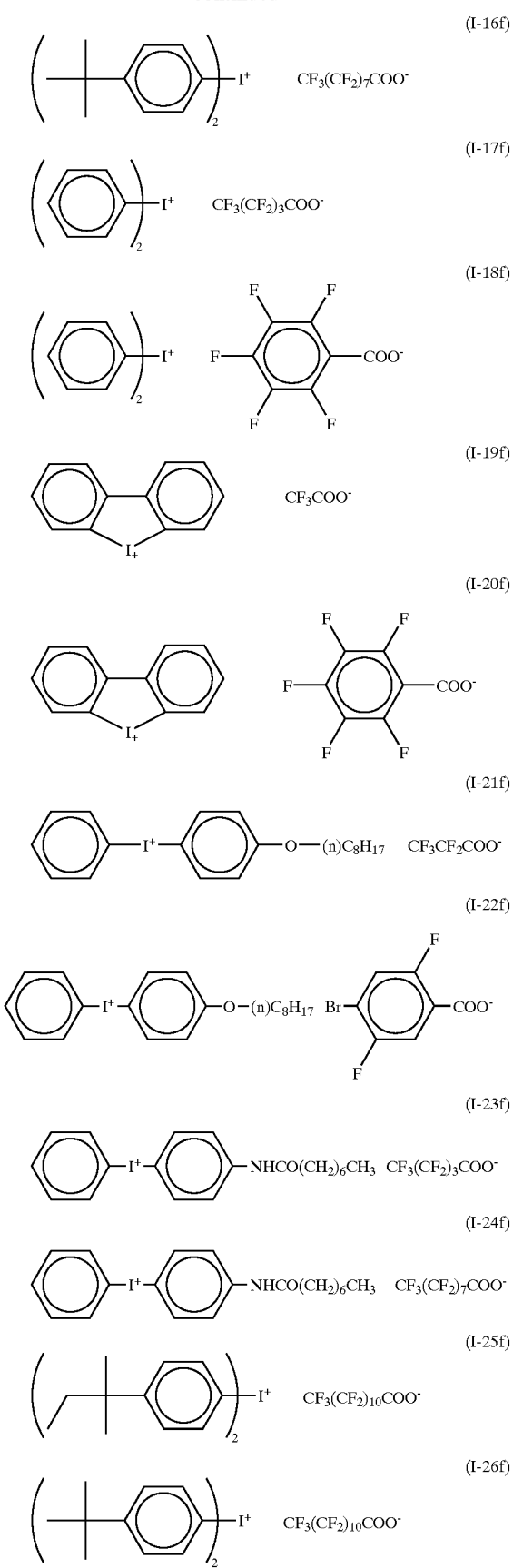

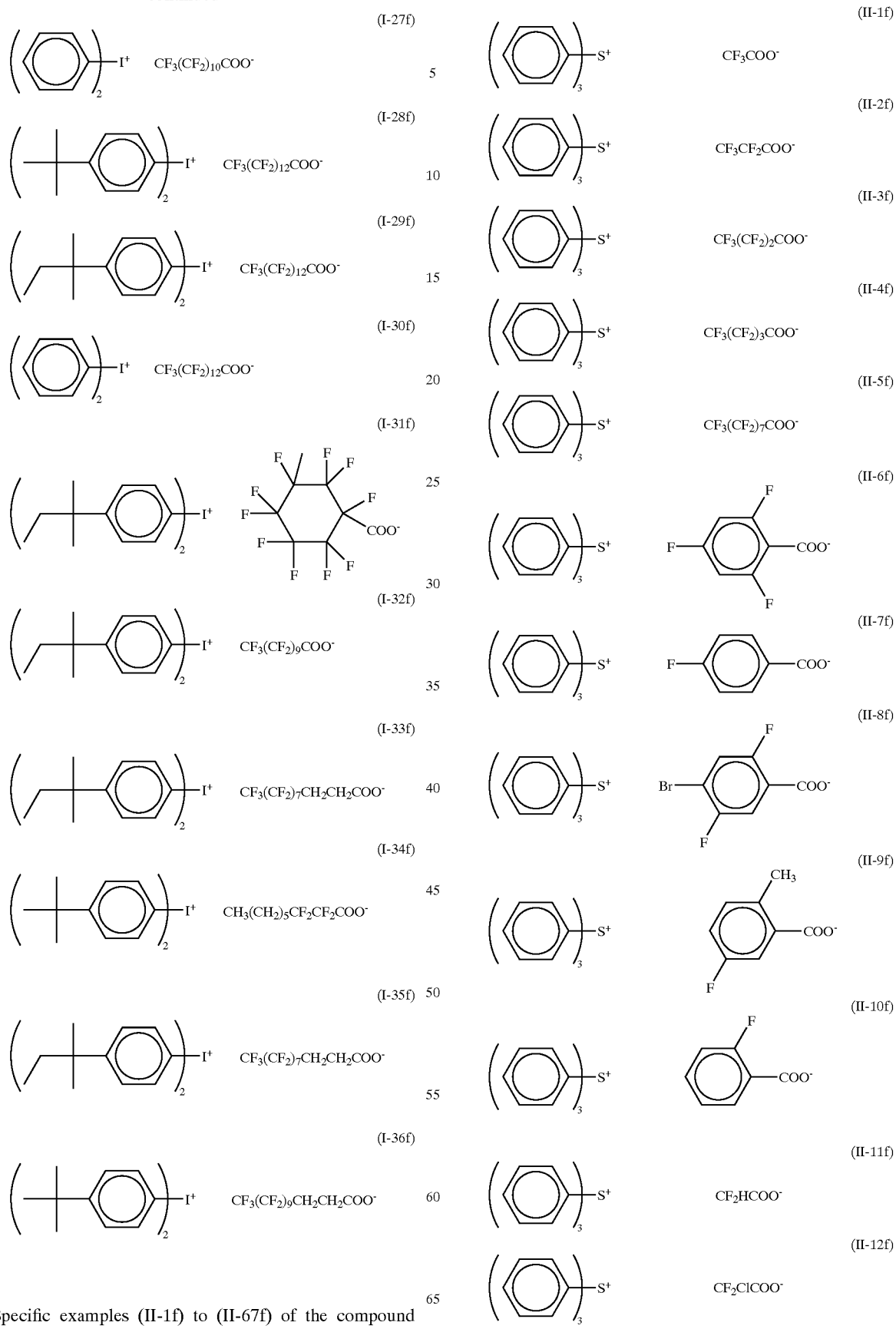
Specific examples (II-1f) to (II-67f) of the compound represented by formula (II):

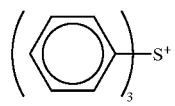  (II-13f)
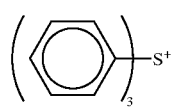 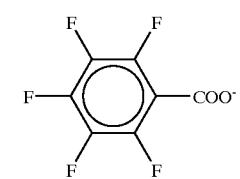 (II-14f)
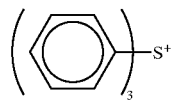  (II-15f)
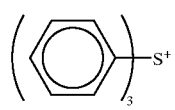 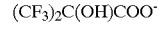 (II-16f)
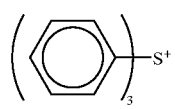 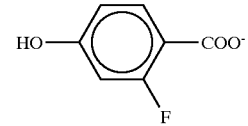 (II-17f)
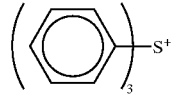 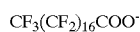 (II-18f)
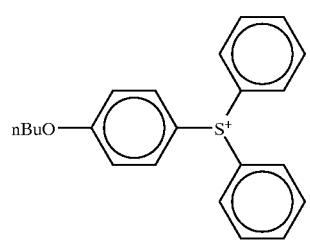  (II-19f)
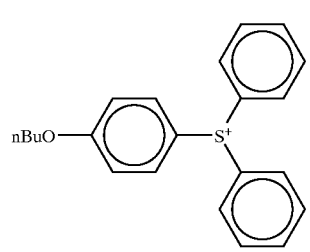 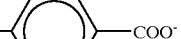 (II-20f)
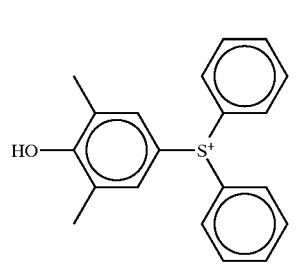  (II-21f)
 
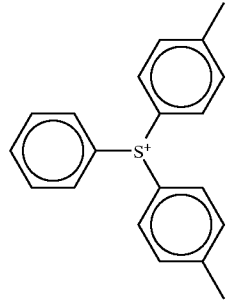 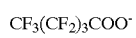 (II-22f)
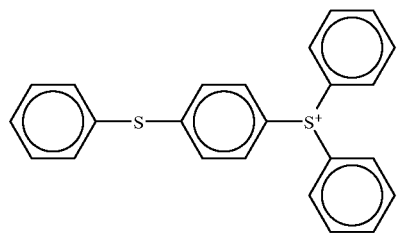  (II-23f)
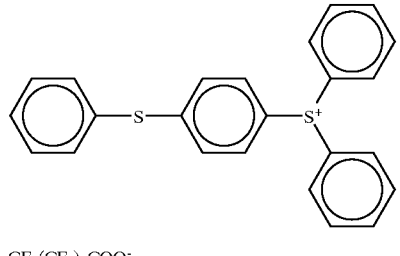 (II-24f)
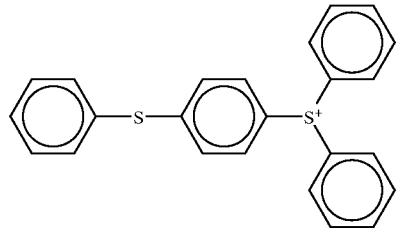 (II-25f)
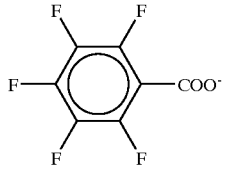
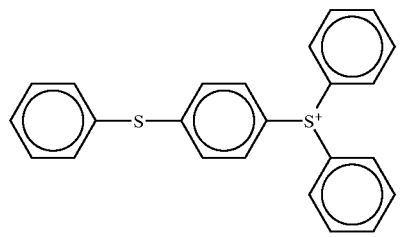 (II-26f)

(II-27f) — mesityl diphenyl sulfonium CF₃(CF₂)₇COO⁻

(II-28f) — mesityl diphenyl sulfonium CF₃(CF₂)₂COO⁻

(II-29f) — (3,4-dimethoxyphenyl)diphenyl sulfonium CF₂ClCOO⁻

(II-30f) — (3,4-dimethoxyphenyl)diphenyl sulfonium CF₃(CF₂)₃COO⁻

(II-31f) — (4-methylphenyl)diphenyl sulfonium CF₃(CF₂)₂COO⁻

(II-32f) — (4-methylphenyl)diphenyl sulfonium pentafluorobenzoate (II-33f) — tris(4-tert-butylphenyl)sulfonium CF₃COO⁻

(II-34f) — tris(4-tert-butylphenyl)sulfonium CF₂HCOO⁻

(II-35f) — tris(4-tert-butylphenyl)sulfonium CF₃(CF₂)₂COO⁻

(II-36f) — tris(4-tert-butylphenyl)sulfonium CF₃(CF₂)₃COO⁻

(II-37f) — tris(4-tert-butylphenyl)sulfonium CF₃(CF₂)₇COO⁻

(II-38f) — tris(4-tert-butylphenyl)sulfonium pentafluorobenzoate (II-39f) — tris(4-tert-butylphenyl)sulfonium 4-fluorobenzoate (II-40f) — tris(4-tert-butylphenyl)sulfonium 4-bromo-2,5-difluorobenzoate (II-41f) — (4-tert-butylphenyl)diphenyl sulfonium 5-fluoro-2-methylbenzoate (II-42f) — (4-tert-butylphenyl)diphenyl sulfonium 2-fluorobenzoate (II-43f)
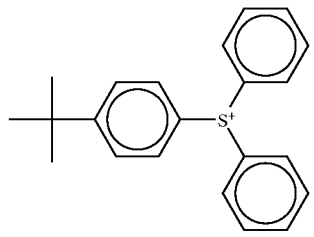
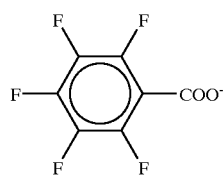
(II-44f)
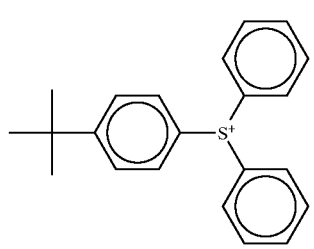 CF$_2$ClCOO$^-$
(II-45f)
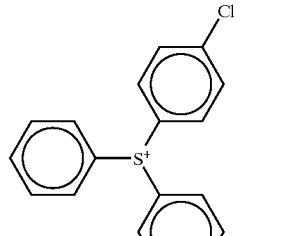 CF$_3$(CF$_2$)$_3$COO$^-$
(II-46f)
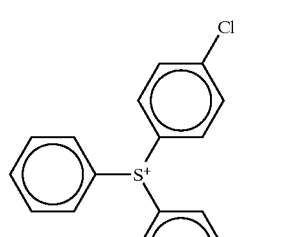 CF$_3$(CF$_2$)$_7$COO$^-$
(II-47f)
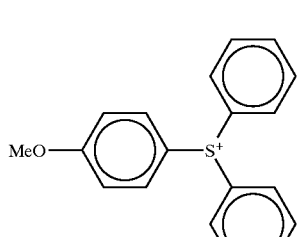
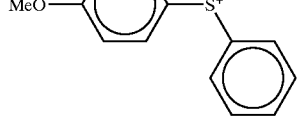
(II-48f)
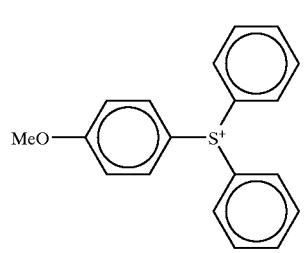 CF$_3$(CF$_2$)$_2$COO$^-$
(II-49f)
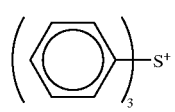 CF$_3$(CF$_2$)$_{10}$COO$^-$
(II-50f)
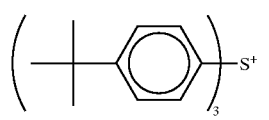 CF$_3$(CF$_2$)$_{10}$COO$^-$
(II-51f)
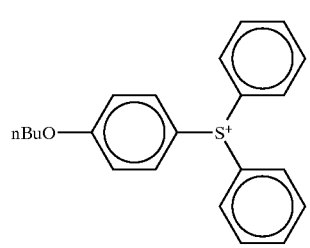 CF$_3$(CF$_2$)$_{10}$COO$^-$
(II-52f)
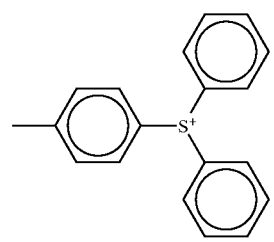 CF$_3$(CF$_2$)$_{10}$COO$^-$
(II-53f)
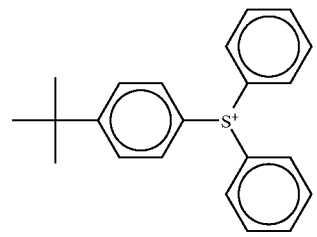 CF$_3$(CF$_2$)$_{10}$COO$^-$
(II-54f)
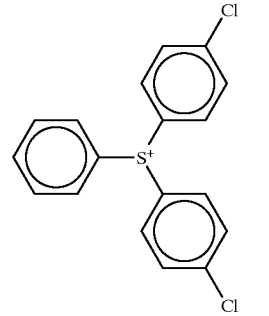 CF$_3$(CF$_2$)$_{10}$COO$^-$

 (II-55f)
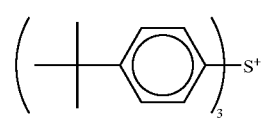 (II-56f)
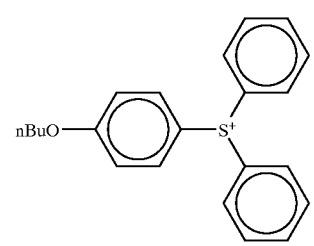 (II-57f)
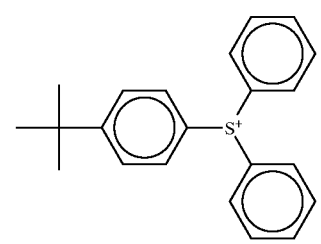 (II-58f)
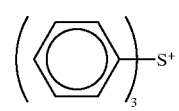 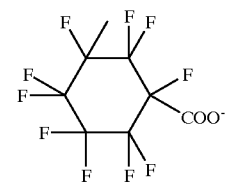 (II-59f)
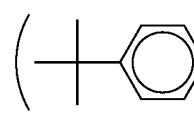 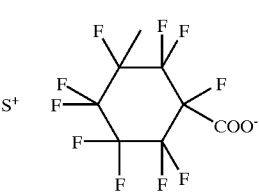 (II-60f)
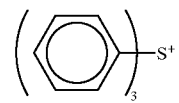 (II-61f)
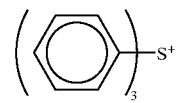 (II-62f)
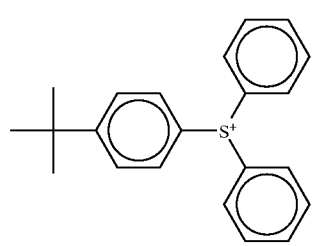 (II-63f)
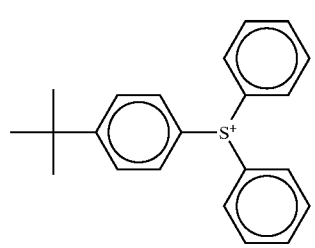 (II-64f)
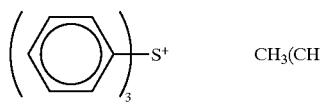 (II-65f)
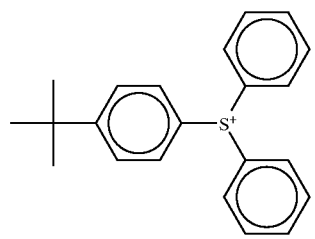 (II-66f)
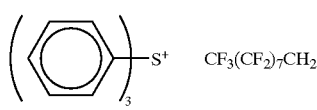 (II-67f)
Specific examples (III-1f) to (III-4f) of the compound represented by formula (III):
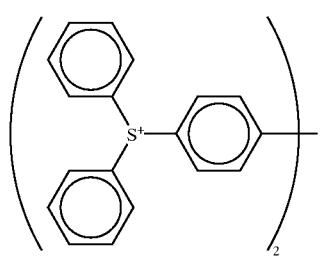 (III-1f)

-continued (III-2f)

(III-3f)

(III-4f)

Specific examples (IV-1f) to (V-4f) of other compounds:

(IV-1f)

(IV-2f)

(IV-3f)

(V-1f)

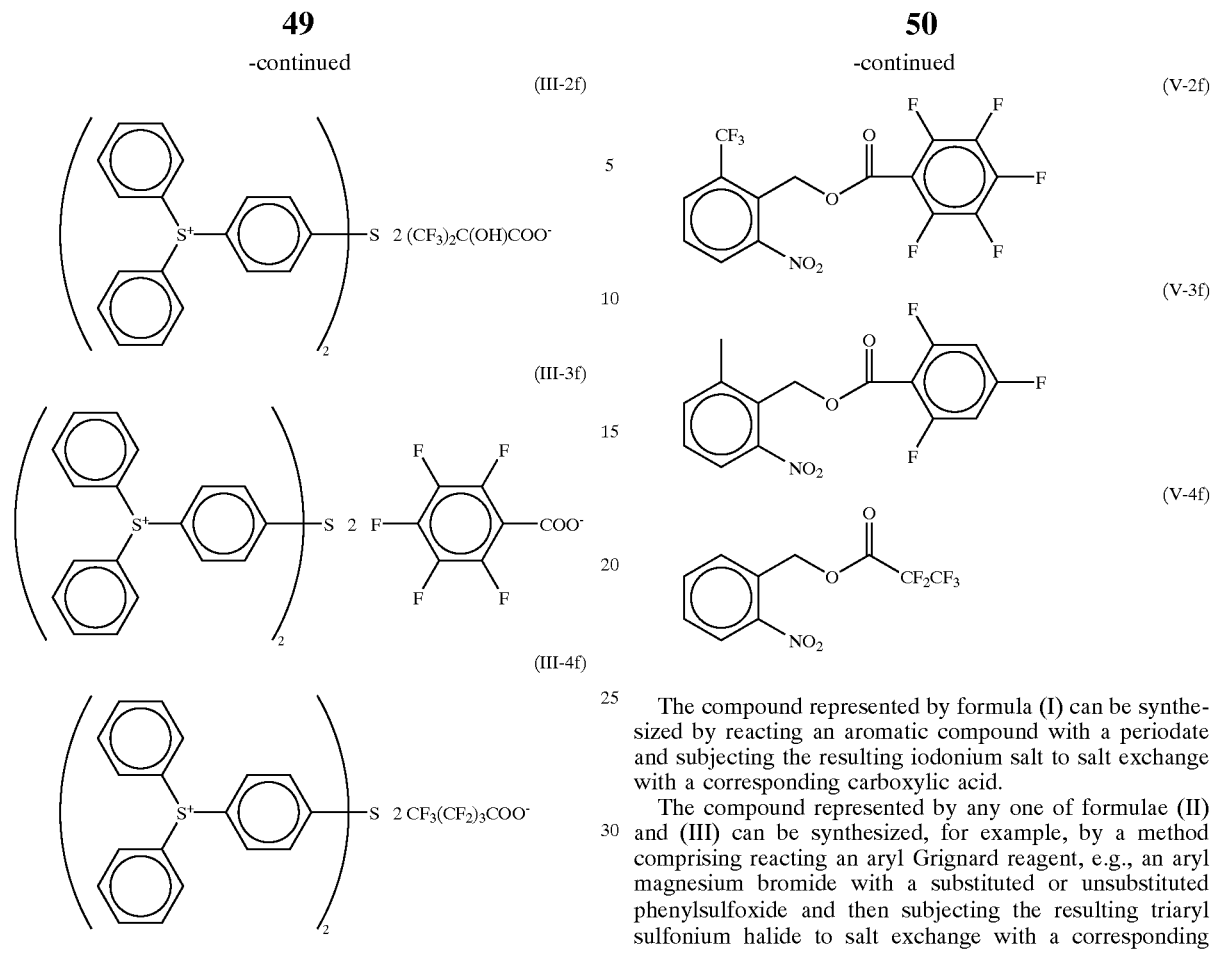
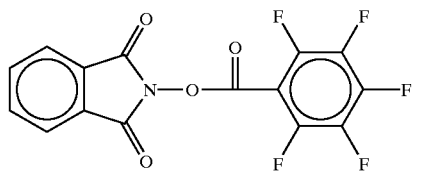
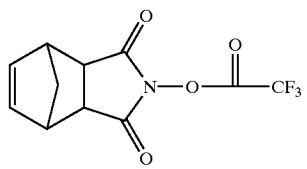
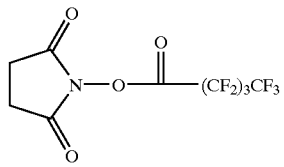
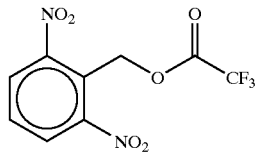

-continued (V-2f)

(V-3f)

(V-4f)

The compound represented by formula (I) can be synthesized by reacting an aromatic compound with a periodate and subjecting the resulting iodonium salt to salt exchange with a corresponding carboxylic acid.

The compound represented by any one of formulae (II) and (III) can be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding carboxylic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The salt exchange can be conducted by introducing once into a halide, followed by converting to a carboxylate using a silver reagent, e.g., silver oxide, or by using an ion exchange resin. For the salt exchange, a carboxylic acid or carboxylate commercially available or obtained by hydrolysis of a commercially available carboxylic acid halide can be employed.

The fluorine-substituted carboxylic acid as the anion portion is preferably that derived from a fluoro-aliphatic compound produced by a telomerization method (also referred to as a telomer method) or an origomerization method (also referred to as an origomer method). Methods for the production of fluoro-aliphatic compound are described, for example, in Nobuo Ishikawa ed., *Fusso-Kagobutsu no Gosei to Kino* (*Synthesis and Function of Fluorine Compounds*), pages 117 to 118, CMC Publishing Co., Ltd. (1987) and Milos Hudlicky and Attila E. Pavlath ed., *Chemistry of Organic Fluorine Compounds II*, Monograph 187, pages 747 to 752, American Chemical Society (1995). The telomerization method comprises a radical polymerization of a fluorine-containing vinyl compound, e.g., tetrafluoroethylene using an alkyl halide having a large chain transfer constant, e.g., an iodide, as a telogen to synthesize a telomer. In the synthesis according to the telomer method, a mixture of plural compounds having a carbon chain length different from each other are obtained, and the mixture may be used as it is or after purification.

(B2b) Compound Capable of Being Decomposed Upon Irradiation of an Actinic Ray or Radiation to Generate a Carboxylic Acid Free from a Fluorine Atom:

The compound capable of being decomposed upon irradiation of an actinic ray or radiation to generate a carboxylic acid free from a fluorine atom includes, for example, compounds represented by the following formulae (AI) to (AV):

In the above formulae, $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$. $R_0$ represents a straight chain, branched or cyclic alkyl group or an aryl group.

$R_a$ and $R_b$ each independently represent a hydrogen atom, a nitro group, a halogen atom, an alkyl group which may have a substituent or an alkoxy group which may have a substituent. $R_c$ and $R_d$ each independently represent a halogen atom, an alkyl group which may have a substituent or an aryl group which may have a substituent. Alternatively, $R_c$ and $R_d$ may be combined with each other to form an aromatic ring or a monocyclic or polycyclic aliphatic hydrocarbon ring (the ring may contain an oxygen atom or a nitrogen atom). $Y_1$ and $Y_2$ each represent a carbon atom, and the $Y_1$–$Y_2$ bond may be a single bond or a double bond. $X^-$ represents an anion of at least one of carboxylic acid compounds represented by formulae shown below. $X_1$ and $X_2$ each independently represent an ester group formed at the carboxy group of at least one of the carboxylic acid compounds represented by formulae shown below.

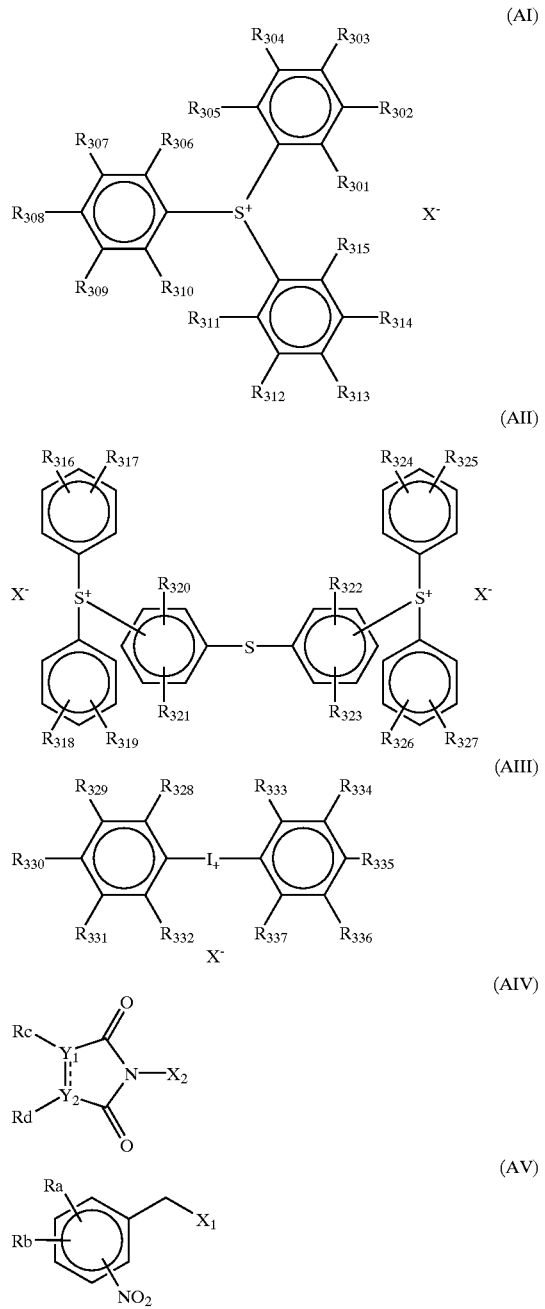

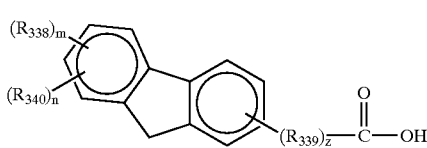

(C10)

In the above formulae, $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 2 to 20 carbon atoms, a straight chain, branched or cyclic alkynyl group having from 2 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms. Examples of the substituent for the aryl group include an alkyl group, a nitro group, a hydroxy group, an alkoxy group, an acyl group, an alkoxycarbonyl group and a halogen atom.

$R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 2 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxyalkylene group having from 2 to 20 carbon atoms. The plural $R_{338}$'s and $R_{339}$'s may be the same or different from each other.

$R_{340}$ represents a hydroxy group or a halogen atom. The plural $R_{340}$'s may be the same or different from each other. m, n, p and q each independently represent an integer of from 0 to 3, provided that m+n≦5 and p+q≦5. z represents 0 or 1.

In formulae (AI) to (AV), the straight chain or branched alkyl group represented by any one of $R_{301}$ to $R_{337}$, $R_a$, $R_b$, $R_c$, $R_d$ and $R_0$ includes that having from 1 to 4 carbon atoms, which may have a substituent, for example, methyl, ethyl, propyl, n-butyl, sec-butyl or tert-butyl group. The cycloalkyl group includes that having from 3 to 8 carbon atoms, which may have a substituent, for example, cyclopropyl, cyclopentyl or cyclohexyl group.

The alkoxy group represented by any one of $R_{301}$ to $R_{337}$, $R_a$ and $R_b$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_{301}$ to $R_{337}$, $R_a$, $R_b$, $R_c$, and $R_d$ includes, for example, fluorine, chlorine, bromine and iodine atoms.

The aryl group represented by any one of $R_0$, $R_c$ and $R_d$ includes that having from 6 to 14 carbon atoms, which may have a substituent, for example, phenyl, tolyl, methoxyphenyl or naphthyl group.

The substituents for the above groups preferably includes an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The aromatic ring or monocyclic or polycyclic aliphatic hydrocarbon ring (the ring may contain an oxygen atom or a nitrogen atom) formed by combining $R_c$ and $R_d$ includes, for example, benzene, naphthalene, cyclohexane, norbornene and oxabicyclo structures.

The sulfonium compound or iodonium compound represented by any one of formulae (AI) to (AIII) for use in the present invention includes as the counter anion represented by $X^-$, an anion ($-COO^-$) of the carboxy group ($-COOH$) of at least one of the carboxylic compounds represented by any one of formulae (C1) to (C10) described above.

The compound represented by any one of formulae (AIV) to (AV) for use in the present invention includes as the substituent $X_1$ or $X_2$, an ester group ($-COO-$) formed from the carboxy group ($-COOH$) of at least one of the carboxylic compounds represented by any one of formulae (C1) to (C10) described above.

The straight chain, branched or cyclic alkyl group having from 1 to 30 carbon atoms (wherein the alkyl group may contain an oxygen atom or a nitrogen atom in the chain thereof) represented by $R_{338}$ includes, for example, methyl, ethyl, propyl, butyl, pentyl, hexyl, cyclohexyl, dodecyl, 1-ethoxyethyl and adamantyl groups.

The straight chain, branched or cyclic alkenyl group having from 2 to 20 carbon atoms includes, for example, ethenyl, propenyl, isopropenyl and cyclohexenyl groups.

The straight chain, branched or cyclic alkynyl group having from 2 to 20 carbon atoms includes, for example, ethynyl and propynyl groups.

The straight chain, branched or cyclic alkoxy group having from 1 to 20 carbon atoms includes, for example, methoxy, ethoxy, propyloxy, butoxy, cyclohexyloxy, isobutoxy and dodecyloxy groups.

The substituted or unsubstituted aryl group having from 6 to 20 carbon atoms includes, for example, phenyl, naphthyl and anthryl groups.

The substituent for the aryl group includes, for example, an alkyl group, a nitro group, a hydroxy group, an alkoxy group, an acyl group, an alkoxycarbonyl group and a halogen atom.

The straight chain, branched or cyclic alkylene group having from 1 to 20 carbon atoms (wherein the alkylene group may contain an oxygen atom or a nitrogen atom in the chain thereof) represented by $R_{339}$ includes, for example, methylene, ethylene, propylene, butylene, isobutylene, ethoxyethylene and cyclohexylene groups.

The straight chain, branched or cyclic alkenylene group having from 2 to 20 carbon atoms includes, for example, vinylene and allylene groups.

Specific examples of such compounds are set forth below, but the present invention should not be construed as being limited thereto.

(I-1)

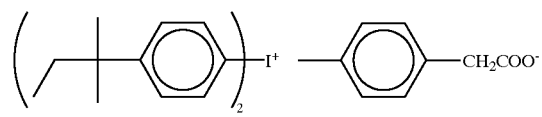

-continued
(I-2)
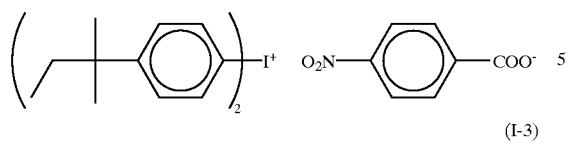
(I-3)
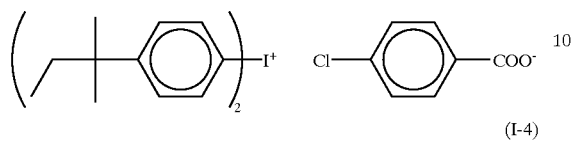
(I-4)
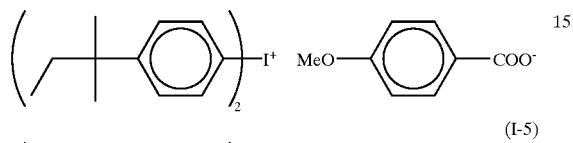
(I-5)
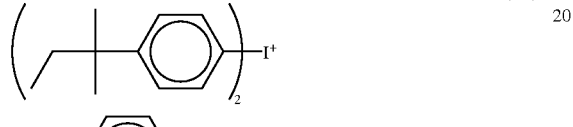
(I-6)
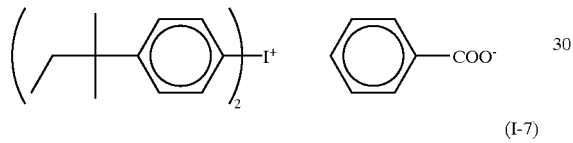
(I-7)
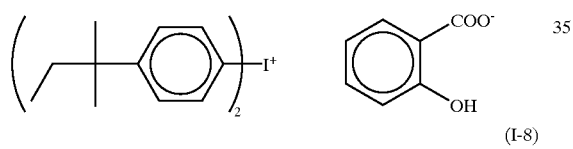
(I-8)
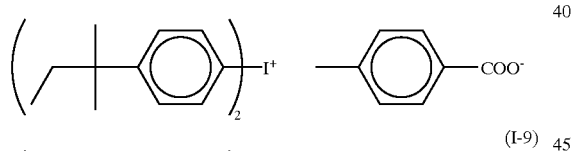
(I-9)
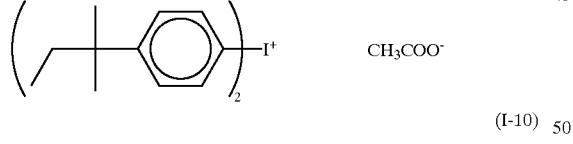
(I-10)
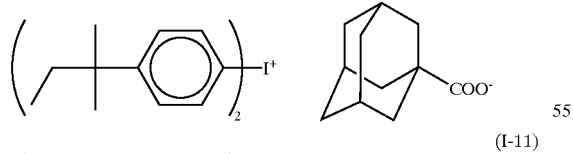
(I-11)
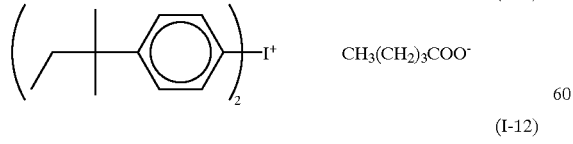
(I-12)
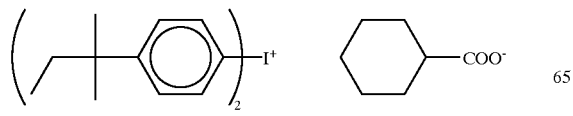
-continued
(I-13)
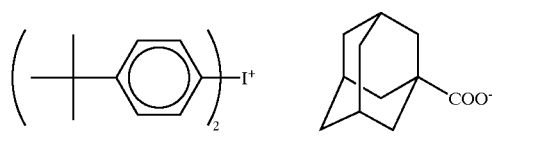
(I-14)
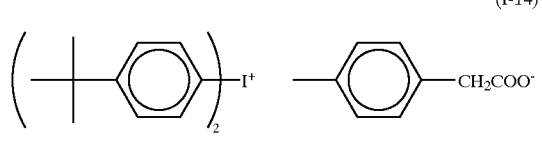
(I-15)
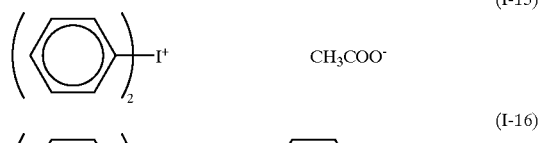
(I-16)
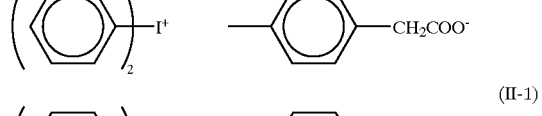
(II-1)
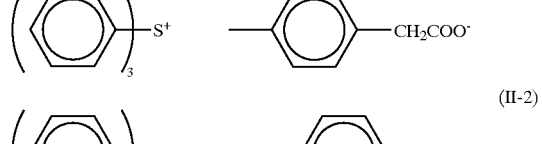
(II-2)
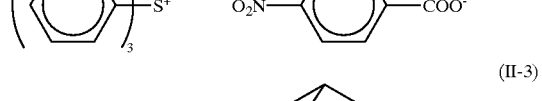
(II-3)
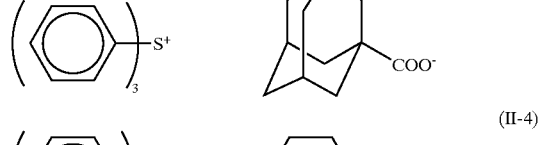
(II-4)
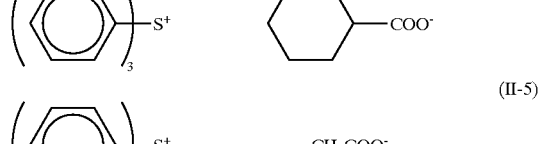
(II-5)
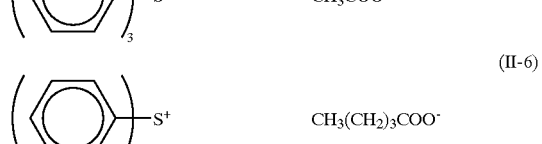
(II-6)
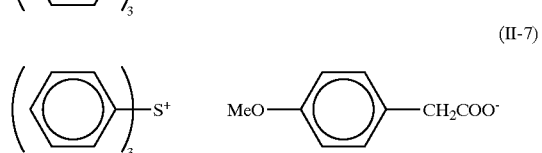
(II-7)
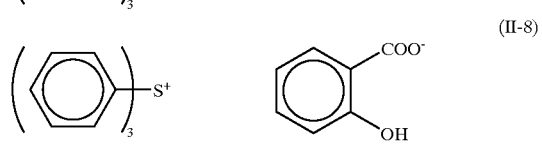
(II-8)
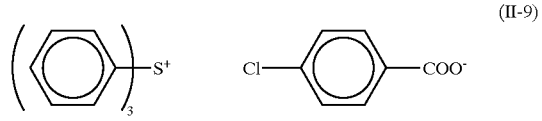
(II-9)
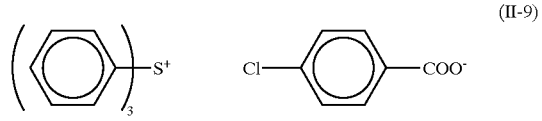

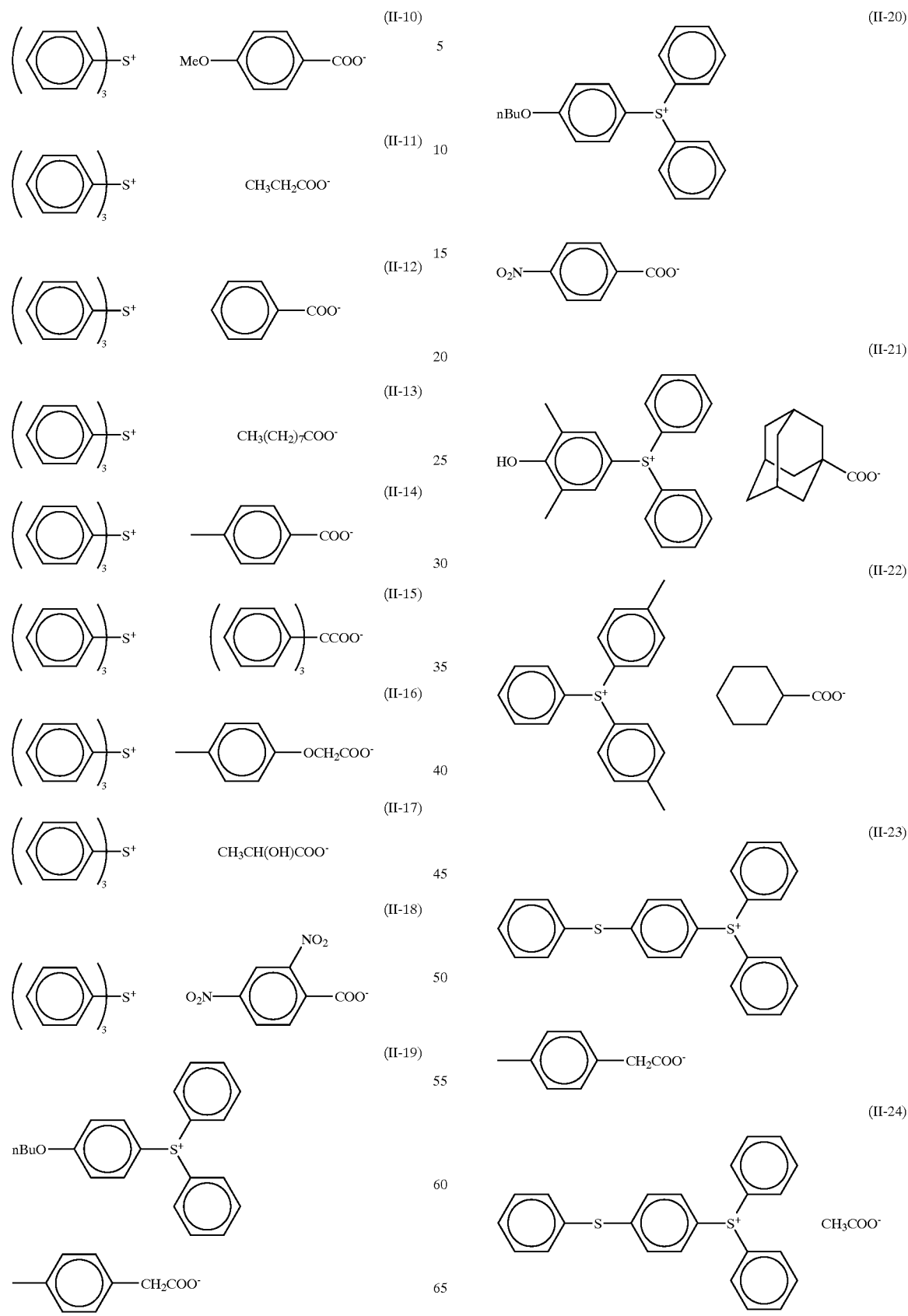

(II-25)
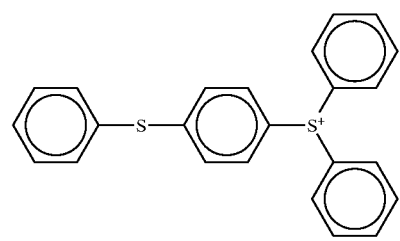
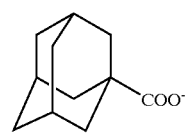
(II-26)
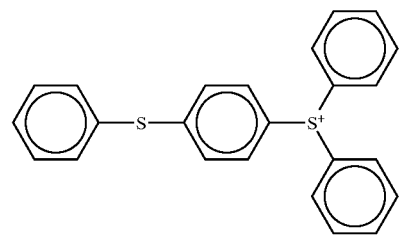
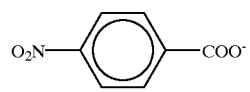
(II-27)
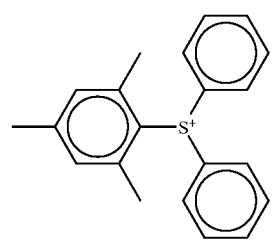
(II-28)
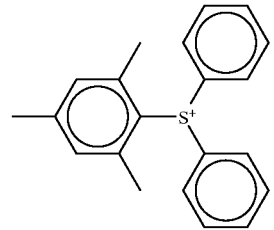  CH₃COO⁻
(II-29)
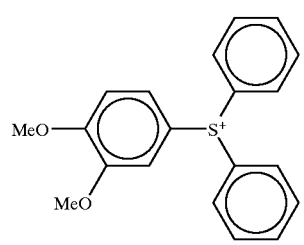
(II-30)
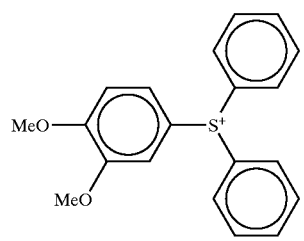  CH₃CH(OEt)COO⁻
(II-31)
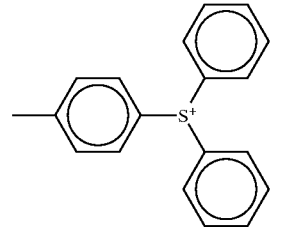  CH₃CH₂COO⁻
(II-32)
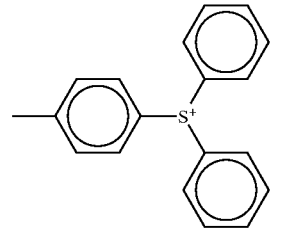  CH₃COO⁻
(II-33)
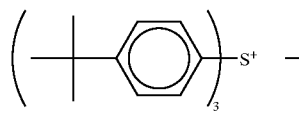  —CH₂COO⁻
(II-34)
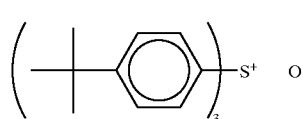  O₂N—COO⁻
(II-35)
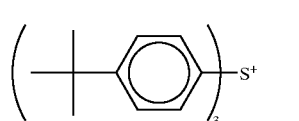 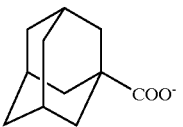
(II-36)
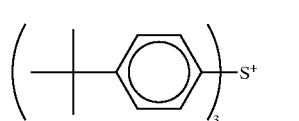 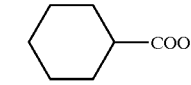
(II-37)
  CH₃COO⁻
(II-38)
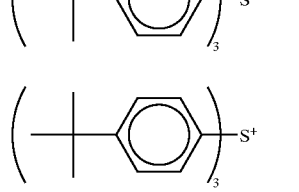  CH₃(CH₂)₃COO⁻

(II-39)
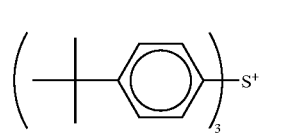
(II-40)
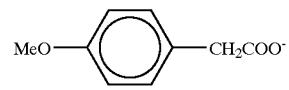
(II-41)
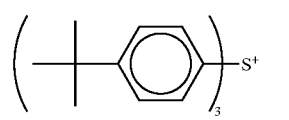
(II-42)
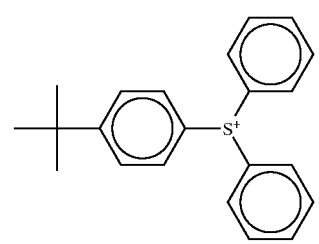
(II-43)
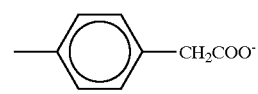 CH₃CH₂COO⁻
(II-44)
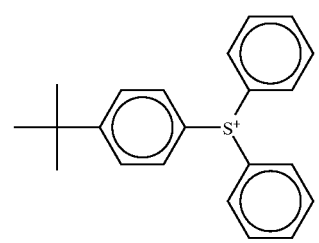
(II-45)
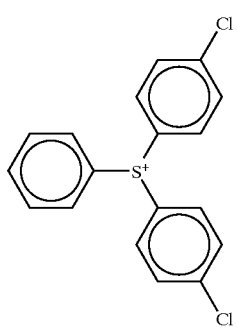
(II-46)
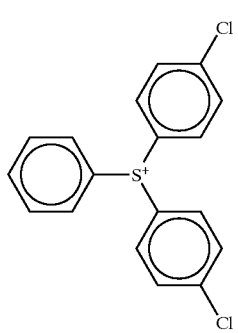
(II-47)
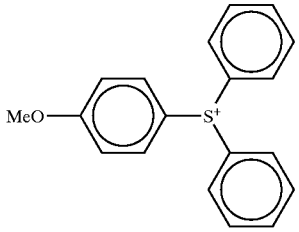
(II-48)
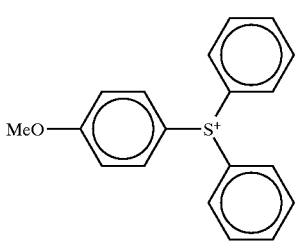 CH₃COO⁻
(III-1)
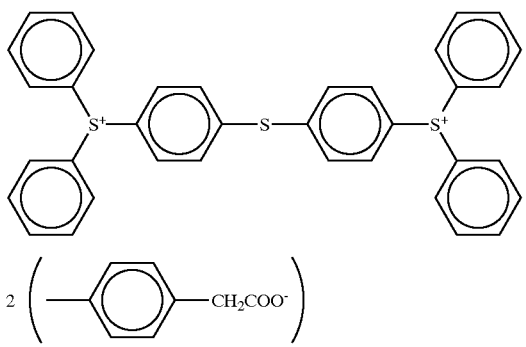

(III-2)

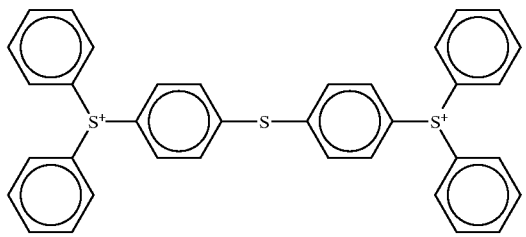

2 CH₃COO⁻

(IV-1)

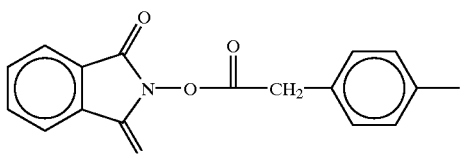

(IV-2)

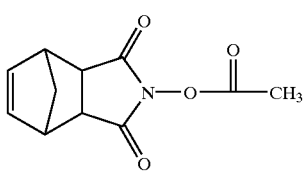

(IV-3)

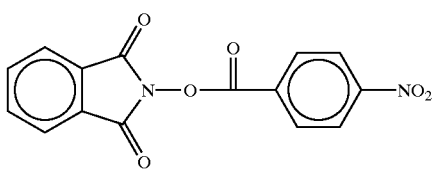

(IV-4)

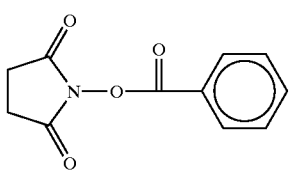

(V-1)

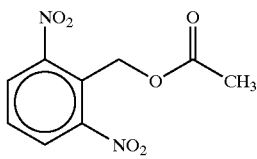

(V-2)

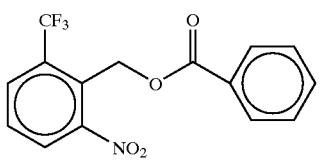

(V-3)

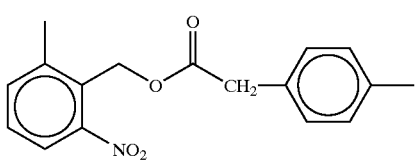

(V-4)

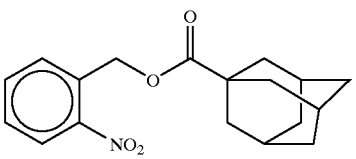

The compounds represented by formulae (AI), (AII) and (AIII) can be synthesized according to methods described in U.S. Pat. No. 3,734,928 or methods described in *Macromolecules*, Vol. 10, 1307 (1977), *Journal of Organic Chemistry*, Vol. 55, 4222 (1990) and *J. Radiat. Curing*, Vol. 5(1), 2 (1978), followed by exchanging the counter anion. The compounds represented by formulae (AIV) and (AV) can be synthesized by reacting an N-hydroxyimide compound with a carboxylic acid chloride under a basic condition or by reacting nitrobenzyl alcohol with a carboxylic acid chloride under a basic condition.

According to the present invention, contrast of concentration distribution of a strong acid generated upon irradiation of an actinic ray or radiation can be enhanced in the vicinity of interface of the irradiated area/unirradiated area (area irradiated in a low energy amount) by using the compound of Component (B1) together with the compound of Component (B2).

A weight ratio of the amount of the compound of Component (B1) to the compound of Component (B2) is ordinarily from 1/1 to 100/0, preferably from 1/1 to 10/1, and particularly preferably from 2/1 to 5/1.

The total amount of the compound of Component (B1) and the compound of Component (B2) is ordinarily from 0.5 to 20% by weight, preferably from 0.75 to 15% by weight, and more preferably from 1 to 10% by weight based on the total solid content of the positive resist composition.

Two or more of the compounds of Components (B1) and (B2) may be used in combination.

[3] Organic Basic Compound (Component (D))

It is preferred that the positive resist composition of the present invention contains an organic basic compound for the purpose of preventing fluctuations in performances (for example, formation of T-top shaped pattern, fluctuation in sensitivity or fluctuation in line width of pattern) with the lapse of time between the irradiation of an actinic ray or radiation and a heat treatment, fluctuations in performances with the lapse of time after coating, or excessive diffusion of the acid at the heat treatment after the irradiation of an actinic ray or radiation, which results in deterioration of the resolution. AS the organic basic compound, for example, an organic basic compound containing a basic nitrogen atom is exemplified, and a compound exhibiting pKa of a conjugated acid of not less than 4 is preferably used.

Specifically, compounds having a structure represented by any one of formulae (A) to (E) shown below are used.

(A)

$$R^{250}-\underset{\underset{R^{252}}{|}}{\overset{\overset{R^{251}}{|}}{N}}$$

(B)

(C)

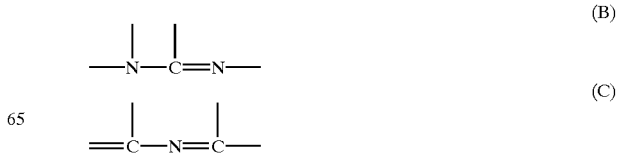

-continued

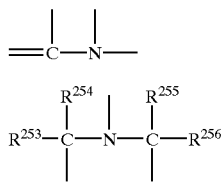
(D)

(E)

In the above formulae, $R^{250}$, $R^{251}$ and $R^{252}$ which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be connected with each other to form a ring; and $R^{253}$, $R^{254}$, $R^{255}$ and $R^{256}$, which may be the same or different, each represent an alkyl group having from 1 to 6 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted piperidines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the organic basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the organic basic compounds for use in the present invention should not be construed as being limited to these compounds.

The organic basic compounds may be used individually or as a mixture of two or more thereof.

A molar ratio of the acid generator to the organic basic compound (acid generator)/(organic basic compound) used in the positive resist composition is preferably from 2.5 to 300. When the molar ratio is less than 2.5, the sensitivity may decrease and the resolution may be degraded. On the other hand, when it exceeds 300, resist pattern size may change with the lapse of time between the exposure and the heat treatment and the resolution may be degraded. The molar ratio of (acid generator)/(organic basic compound) is preferably from 5.0 to 200, and more preferably from 7.0 to 150.

[4] Surface Active Agent

It is preferred that the positive resist composition of the present invention contains a surface active agent, particularly, a fluorine-based and/or silicon-based surface active agent. Specifically, the positive resist composition of the present invention preferably contains one or more of a fluorine atom-containing surface active agent, a silicon atom-containing surface active agent and a surface active agent containing both a fluorine atom and a silicon atom. The addition of such a fluorine-based and/or silicon-based surface active agent is effective for the suppression of development defect and the improvement in coating property.

Examples of the surface active agent include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,296,143, 5,294,511 and 5,824,451. Commercially available surface active agents described below may also be used as they are.

Examples of the commercially available surface active agent, which can be used, include fluorine-based or silicon-based surface active agents, e.g., Eftop EF301, EF303 and EF352 (manufactured by Shin-Akita Kasei Co., Ltd.), Florad FC430 and 431 (manufactured by Sumitomo 3M Ltd.), Megafac F171, F173, F176, F189 and R08 (manufactured by Dainippon Ink and Chemicals, Inc.), Ashahiguard AG710, Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surface active agent.

The amount of surface active agent used is ordinarily from 0.01 to 2% by weight, and preferably from 0.01 to 1% by weight, based on the solid content the positive resist composition of the present invention. The surface active agents may be used individually or in combination of two or more thereof.

[5] Other Components used in the Positive Resist Composition of the Present Invention (1) Solvent (Component (C))

The positive resist composition of the present invention is used by dissolving the above-described components in a solvent that can dissolve the components, and coating the resulting solution on a substrate. Examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

The steps of pattern formation on the resist film, for example, in the production of precise integrated circuit devices comprises applying the positive resist composition of the present invention to a substrate (for example, silicon/silicon dioxide coating, a transparent substrate, e.g., glass substrate or ITO substrate), irradiating the resist film using an actinic ray or radiation lithography apparatus, followed by heating, developing, rinsing and drying. Thus, good resist patterns are obtained.

A developing solution, which can be used for the positive resist composition of the present invention, is an aqueous solution of alkali, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide, tetraethylammonium hydroxide or choline, and a cyclic amine, e.g., pyrrole or piperidine. A developing solution prepared by adding an appropriate amount of an alcohol, for example, isopropyl alcohol or a surface active agent, for example, a nonionic surface active agent to the above-described aqueous solution of alkali is also used.

Of the developing solutions, a developing solution containing a quaternary ammonium salt is preferred and, a developing solution containing tetramethylammonium hydroxide or a developing solution containing choline is more preferred.

The present invention will be described in greater detail with reference to the following examples, but the present invention should not be construed as being limited thereto.

<Synthesis of Component (A)>

SYNTHESIS EXAMPLE 1

Synthesis of Resin (1)

In 300 g of ethanol was dissolved 30 g of poly (4-(2-hydroxyhexafluoroisopropyl)styrene) and to the solution was added 3.0 g of Rh/C (rhodium carried on activated carbon powder). The mixture was put in an autoclave and the autoclave was pressurized with hydrogen gas to conduct reaction. After removing the catalyst, the product was concentrated by a evaporator and the residue was reprecipitated with 500 ml of hexane with stirring. The polymer deposited was recovered by filtration. Yield was 23 g. As a result of examining the resulting polymer by means of NMR measurement, it was found that the aromatic C=C bond included in the starting material was hydrogenated at a ratio of 60%. A weight average molecular weight (Mw) of the polymer measured by GPC (THF solvent) was 13,500. The polymer recovered was dried in a vacuum dryer at 40° C.

In a flask, 20 g of the polymer described above was dissolved in 100 ml of desiccated THF. To the solution were added 16.0 g of tert-butyl dicarbonate and then 7.6 g of triethylamine, and the mixture was stirred at room temperature for 5 hours. The reaction solution was reprecipitated with 1,500 ml of distilled water with stirring to deposit a polymer. The polymer was dried in a vacuum dryer to obtain Resin (1). As a result of examining the polymer by means of NMR measurement, it was found that the hydroxy group was subjected to tert-butoxycarbonylation (tert-Boc) at a ratio of 30%.

Resins (2) and (3) and Resin (C1) for comparison were synthesized in a similar manner.

The structures of Resins (1), (2), (3) and (C1) are shown below.

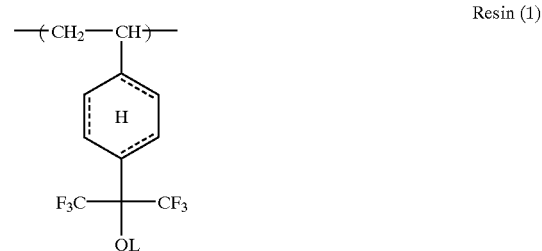

Resin (1)

In Resin (1), the hydrogenation rate of benzene ring was 60%, the tert-butoxycarbonylation rate of L was 30%, and the weight average molecular weight was 13,500.

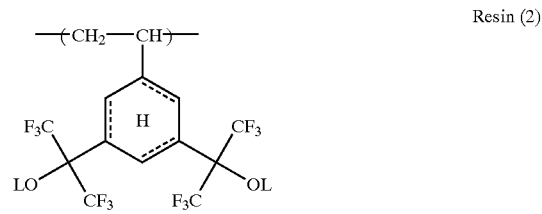

Resin (2)

In Resin (2), the hydrogenation rate of benzene ring was 60%, the tert-butoxycarbonylation rate of L was 30%, and the weight average molecular weight was 9,500.

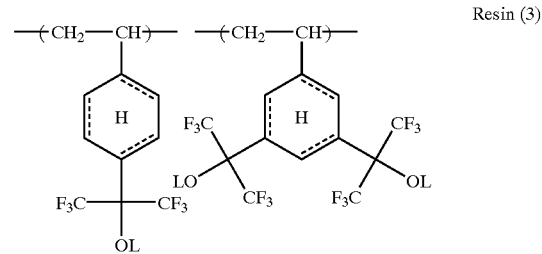

Resin (3)

In Resin (3), a molar ratio of repeating unit was 3:2 from left to right, the hydrogenation rate of benzene ring was 60%, the tert-butoxycarbonylation rate of L was 30%, and the weight average molecular weight was 15,000.

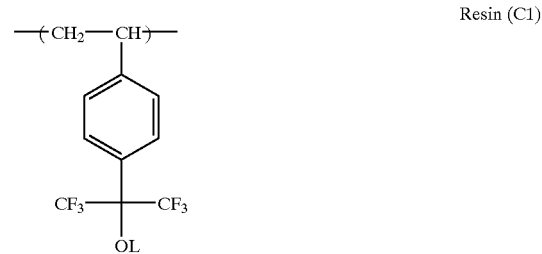

Resin (C1)

In Resin (C1), the tert-butoxycarbonylation rate of L was 30%, and the weight average molecular weight was 15,000.

<Synthesis of Component (B)>

SYNTHESIS EXAMPLE 1

Synthesis of Triphenylsulfonium Nonafluorobutanesulfonate (VII-4)

In 500 ml of methanol was dissolved 20 g of triphenylsulfonium iodide, and to the solution was added 12.5 g of silver oxide, followed by stirring at room temperature for 4 hours. The reaction solution was filtered to remove the silver compound, and to the filtrate was added 14.9 g of nonafluorobutanesulfonic acid. The solution was concentrated, to the resulting oily product was added 300 ml of diisopropyl ether, and the mixture was sufficiently stirred. Then, the diisopropyl ether was removed by decantation. The procedure of treatment with diisopropyl ether was repeated again. The resulting oily product was dried under a reduced pressure to obtain 18 g of the desired compound.

SYNTHESIS EXAMPLE 2

Synthesis of Triphenylsulfonium 4-Dodecylbenzenesulfonate (PAG4-1)

In 500 ml of methanol was dissolved 10 g of triphenylsulfonium iodide, and to the solution was added 4.44 g of silver oxide, followed by stirring at room temperature for 4 hours. The reaction solution was filtered to remove the silver compound, and to the filtrate was added 4.67 g of 4-dodecylbenzenesulfonic acid. The solution was concentrated, to the resulting oily product was added 300 ml of diisopropyl ether, and the mixture was sufficiently stirred. Then, the diisopropyl ether was removed by decantation. The procedure of treatment with diisopropyl ether was repeated again. The resulting oily product was dried under a reduced pressure to obtain 6 g of the desired compound.

SYNTHESIS EXAMPLE 3

Synthesis of Triphenylsulfonium Nonafluoropentanoate (II-4f)

In 500 ml of methanol was dissolved 20 g of triphenylsulfonium iodide, and to the solution was added 12.5 g of silver oxide, followed by stirring at room temperature for 4 hours. The reaction solution was filtered to remove the silver compound, and to the filtrate was added 14.9 g of nonafluoropentanoic acid. The solution was concentrated, to the resulting oily product was added 300 ml of diisopropyl ether, and the mixture was sufficiently stirred. Then, the diisopropyl ether was removed by decantation. The procedure of treatment with diisopropyl ether was repeated again. The resulting oily product was dried under a reduced pressure to obtain 18 g of the desired compound.

Examples 1 to 6 and Comparative Example 1

A polymer solution was prepared by dissolving 1.2 g of Component (A), 0.024 g of Component (B1), 0.006 g of Component (B2), 100 ppm of surface active agent of Component (E) in the polymer solution and 0.0012 g of organic basic compound of Component (D) in 19.6 g of Component (C), as shown in Table 1 below. The solution was filtered through a Teflon filter having a pore size of 0.1 μm to prepare a positive resist solution for each of Examples 1 to 6 and Comparative Example 1.

TABLE 1

| | (A) Resin | (B1) (weight ratio) | (B2) | (C) Solvent (weight ratio) | (E) Surface Active Agent | (D) Organic Basic Compound |
|---|---|---|---|---|---|---|
| Example 1 | (1) | (VII-4) | — | S-2 | W-1 | (N-1) |
| Example 2 | (2) | (VII-14) | — | S-2 | W-2 | (N-1) |
| Example 3 | (3) | (VII-24) | — | S-2 | W-1 | (N-1) |
| Example 4 | (1) | (VII-36)/(PAG4-1) (50/50) | — | S-2/S-1 (80/20) | W-1 | (N-2) |
| Example 5 | (2) | (VII-54) | (II-1f) | S-2 | W-1 | (N-3) |
| Example 6 | (3) | (PAG4-34) | (II-1f) | S-2/S-1 (90/10) | W-2 | (N-1) |
| Comparative Example 1 | (C1) | (VII-4) | | S-2 | W-1 | (N-1) |

The abbreviations of components used in Table 1 are explained below.

N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink and Chemicals, Inc.) (fluorine-based)
W-2: Megafac R08 (manufactured by Dainippon Ink and Chemicals, Inc.) (fluorine- and silicon-based)
S-1: Propylene glycol monomethyl ether
S-2: Propylene glycol monomethyl ether acetate The positive resist solution described above was uniformly coated on a silicon wafer provided with an anti-reflecting coating (DUV42-6 manufactured by Brewer Science, Inc.) using a spin coater and dried by heating at 120° C. for 60 seconds to prepare a positive resist film having a thickness of 0.1 μm. The resist film was subjected to pattern exposure through a line and space mask using an KrF micro stepper, heated on a hot plate at 110° C. for 90 seconds immediately after the exposure. Then, the resist film was developed with a 2.38% aqueous tetramethylammonium hydroxide solution at 23° C. for 30 seconds, rinsed with pure water for 30 seconds and dried. The pattern thus obtained on the silicon wafer was evaluated with respect to the resist performances in the following manner.

[Line Edge Roughness]

At 50 points in the range of length of 5 μm in the longitudinal direction of the line pattern, distance was measured from the standard line where the edge should be present to the edge of line pattern using a critical dimension scanning electron microscope (S-8840 manufactured by Hitachi, Ltd.), thereby determining standard deviation and calculating 3σ. As the value is smaller, the better performance of line edge roughness is obtained.

[Developing Time Dependency]

The resist film was exposed in an exposure energy amount necessary for reproducing a line and space mask pattern of 150 nm after development in case of setting the developing time for 30 seconds and then developed in the same manner as described above except for changing the developing time to 90 seconds to form a pattern. The pattern formed was measured and the difference from 150 nm was determined.

The results of evaluations are shown in Table 2 below.

TABLE 2

|  | Line Edge Roughness (nm) | Developing Time Dependency (nm) |
| --- | --- | --- |
| Example 1 | 9.2 | 4.7 |
| Example 2 | 9.5 | 4.6 |
| Example 3 | 9.8 | 4.8 |
| Example 4 | 8.5 | 4.4 |
| Example 5 | 8.5 | 4.5 |
| Example 6 | 8.8 | 4.5 |
| Comparative Example 1 | 14.9 | 10.3 |

From the results shown in Table 2, it can be seen that the positive resist composition of the present invention exhibits small line edge roughness and developing time dependency and is excellent.

[Evaluation of Transparency]

Each of the positive resist solutions for Examples 1 to 3 and Comparative Example 1 described above was coated on a CaF$_2$ plate having a diameter of one inch. With each plate, absorbance at 157 nm was measured by means of a vacuum ultraviolet spectrometer (VU-201 manufactured by JASCO Corp.). The thickness of resist film was measured using a stylus profilometer. The results obtained are shown in Table 3 below.

TABLE 3

|  | Absorbance at 157 nm ($\mu m^{-1}$) |
| --- | --- |
| Example 1 | 2.9 |
| Example 2 | 2.7 |
| Example 3 | 2.8 |
| Comparative Example 1 | 3.7 |

It is apparent from the results shown in Table 3 that the positive resist composition of the present invention has excellent transparency to an F2 excimer laser beam (157 nm).

According to the present invention, the positive resist composition, which is improved in the line edge roughness, developing time dependency and transparency to an F2 excimer laser beam (157 nm), can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition comprising (A) a resin, which is decomposed by the action of an acid to increase solubility in an alkali developing solution, having a repeating unit represented by formula (Y) shown below, (B) a compound capable of generating an acid upon irradiation of an actinic ray or radiation, and (C) a solvent:

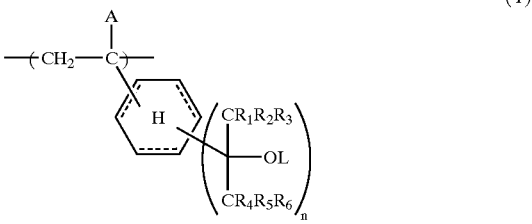

(Y)

wherein, $R_1$ to $R_6$, which may be the same or different, each represent a hydrogen atom, a fluorine atom, an alkyl group or a substituted alkyl group in which at least one hydrogen atom is substituted with a fluorine atom, provided that at least one of $R_1$ to $R_6$ is a fluorine atom; L represents a hydrogen atom or a group decomposable upon the action of an acid; n represents 1 or 2, when n is 2, two $R_1$'s to $R_6$'s and L's may be the same or different from each other; A represents a hydrogen atom, a fluorine atom, a chlorine atom, a methyl group, a cyano group or a trifluoromethyl group; and the structural formula (YA) shown below represents a benzene ring structure hydrogenated at least partially.

(YA)

2. The positive resist composition as claimed in claim 1, wherein the compound capable of generating an acid upon irradiation of an actinic ray or radiation of (B) is (B1) a compound capable of generating an organic sulfonic acid upon irradiation of an actinic ray or radiation.

3. The positive resist composition as claimed in claim 2, which further comprises (B2) a compound capable of being decomposed upon irradiation of an actinic ray or radiation to generate a carboxylic acid.

4. The positive resist composition as claimed in claim 1, wherein the group decomposable upon the action of an acid represented by L is a group represented any one of formulae —C ($R_{36}$) ($R_{37}$) ($R_{38}$), —C ($R_{36}$) ($R_{37}$) (O$R_{39}$), —COO—C ($R_{36}$) ($R_{37}$) ($R_{38}$), —C($R_{01}$) ($R_{02}$) (O$R_{39}$) and —C ($R_{01}$) ($R_{02}$) COO—C ($R_{36}$) ($R_{37}$) ($R_{38}$), wherein $R_{36}$ to $R_{39}$ each independently represent an alkyl group which may have a substituent, a cycloalkyl group which may have a substituent, an alkenyl group which may have a substituent, an aralkyl group which may have a substituent or an aryl group which may have a substituent; or $R_{36}$ and $R_{39}$ may be connected with each other to from a ring; and $R_{01}$ and $R_{02}$ each independently represent a hydrogen atom, an alkyl group which may have a substituent, a cycloalkyl group which may have a substituent, an alkenyl group which may have a substituent, an aralkyl group which may have a substituent or an aryl group which may have a substituent.

5. The positive resist composition as claimed in claim 1, wherein the resin of (A) further comprises a repeating unit derived from a monomer selected from an acrylate, an acrylamide, a methacrylate, a methacrylamide, an allyl compound, a vinyl ether, a vinyl ester, a styrene, a crotonate, a dialkyl ester of maleic acid or fumaric acid, maleic anhydride, maleimide, acrylonitrile, methacrylonitrile and maleonitrile.

6. The positive resist composition as claimed in claim 1, wherein the resin of (A) has a weight average molecular weight of from 1,000 to 200,000 and a molecular weight distribution of from 1 to 10.

7. The positive resist composition as claimed in claim 1, wherein an amount of the resin of (A) is from 50 to 99.5% by weight based on the total solid content of the positive resist composition.

8. The positive resist composition as claimed in claim 2, wherein the compound capable of generating an organic sulfonic acid upon irradiation of an actinic ray or radiation of (B1) is (B1a) a compound capable of generating a sulfonic acid containing a fluorine atom upon irradiation of an actinic ray or radiation.

9. The positive resist composition as claimed in claim 2, wherein the compound capable of generating an organic sulfonic acid upon irradiation of an actinic ray or radiation of (B1) is (B1b) a compound capable of generating a sulfonic acid free from a fluorine atom upon irradiation of an actinic ray or radiation.

10. The positive resist composition as claimed in claim 8, wherein the compound capable of generating a sulfonic acid containing a fluorine atom upon irradiation of an actinic ray or radiation of (B1a) is an iodonium salt represented by formula (PAG3) shown below or a sulfonium salt represented by formula (PAG4) shown below:

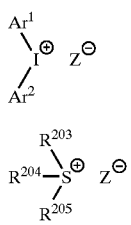

(PAG3)

(PAG4)

wherein, $Ar^1$ and $Ar^2$ each independently represent a substituted or unsubstituted aryl group; $R^{203}$, $R^{204}$ and $R^{205}$ each independently represent a substituted or unsubstituted alkyl group or a substituted or unsubstituted aryl group; $Z^-$ represents an anion of sulfonic acid having at least one fluorine atom; or two of $R^{203}$, $R^{204}$ and $R^{205}$, or $Ar^1$ and $Ar^2$ may be combined with each other through a single bond or a substituent.

11. The positive resist composition as claimed in claim 9, wherein the compound capable of generating a sulfonic acid free from a fluorine atom upon irradiation of an actinic ray or radiation of (B1b) is an iodonium salt represented by formula (PAG3) shown below or a sulfonium salt represented by formula (PAG4) shown below:

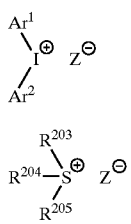

(PAG3)

(PAG4)

wherein, $Ar^1$ and $Ar^2$ each independently represent a substituted or unsubstituted aryl group; $R^{203}$, $R^{204}$ and $R^{205}$ each independently represent a substituted or unsubstituted alkyl group or a substituted or unsubstituted aryl group; $Z^-$ represents an anion of sulfonic acid free from a fluorine atom; or two of $R^{203}$, $R^{204}$ and $R^{205}$, or $Ar^1$ and $Ar^2$ may be combined with each other through a single bond or a substituent.

12. The positive resist composition as claimed in claim 3, wherein the compound capable of being decomposed upon irradiation of an actinic ray or radiation to generate a carboxylic acid of (B2) is (B2a) a compound capable of being decomposed upon irradiation of an actinic ray or radiation to generate a carboxylic acid containing a fluorine atom.

13. The positive resist composition as claimed in claim 3, wherein the compound capable of being decomposed upon irradiation of an actinic ray or radiation to generate a carboxylic acid of (B2) is (B2b) a compound capable of being decomposed upon irradiation of an actinic ray or radiation to generate a carboxylic acid free from a fluorine atom.

14. The positive resist composition as claimed in claim 12, wherein the compound capable of being decomposed upon irradiation of an actinic ray or radiation to generate a carboxylic acid containing a fluorine atom of (B2a) is a compound represented by any one of formulae (I) to (III) shown below:

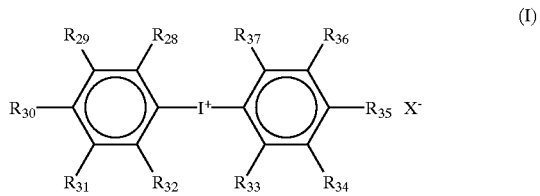

(I)

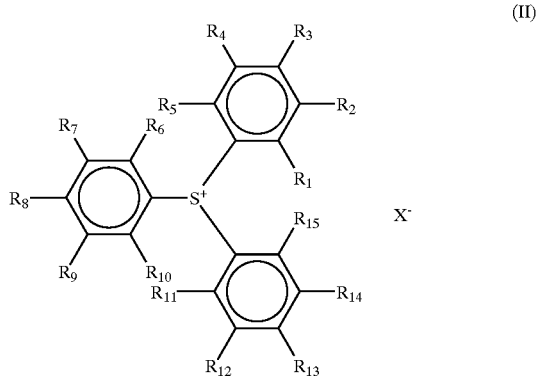

(II)

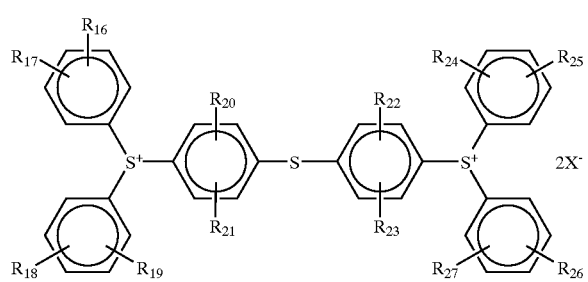

(III)

wherein, $R_1$ to $R_{37}$ each independently represent a hydrogen atom, a straight chain, branched or cyclic alkyl group, a straight chain, branched or cyclic alkoxy group, a hydroxy group, a halogen atom or a group of $-S-R_{38}$; $R_{38}$ represents a straight chain, branched or cyclic alkyl group or an aryl group; and $X^-$ represents an anion of an aliphatic or aromatic carboxylic acid substituted with at least one fluorine atom.

15. The positive resist composition as claimed in claim 12, wherein the compound capable of being decomposed upon irradiation of an actinic ray or radiation to generate a carboxylic acid free from a fluorine atom of (B2b) is a compound represented by any one of formulae (AI) to (AV) shown below:

(AI)

[Structure AI: Triarylsulfonium cation with substituents R301–R315 on three phenyl rings attached to S+, with counterion X−]

(AII)

[Structure AII: Bis-sulfonium salt with two S+ centers, each bearing two phenyl groups (R316–R319 and R324–R327), linked through phenylene-S-phenylene bridge (R320–R323), with two X− counterions]

(AIII)

[Structure AIII: Diaryliodonium cation with two phenyl rings bearing R328–R337, central I+, and X− counterion]

(AIV)

[Structure AIV: Cyclic imide structure with Rc, Rd, Y1, Y2, and N–X2 group, with two carbonyl oxygens]

(AV)

[Structure AV: Benzyl group with Ra, Rb substituents on ring, CH2–X1, and NO2 group]

wherein $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$; $R_0$ represents a straight chain, branched or cyclic alkyl group or an aryl group; $R_a$ and $R_b$ each independently represent a hydrogen atom, a nitro group, a halogen atom, an alkyl group which may have a substituent or an alkoxy group which may have a substituent; $R_c$ and $R_d$ each independently represent a halogen atom, an alkyl group which may have a substituent or an aryl group which may have a substituent, or $R_c$ and $R_d$ may be combined with each other to form an aromatic ring or a monocyclic or polycyclic hydrocarbon ring (the ring may contain an oxygen atom or a nitrogen atom); $Y_1$ and $Y_2$ each represent a carbon atom, and the $Y_1$–$Y_2$ bond may be a single bond or a double bond; X− represents an anion of at least one of carboxylic acid compounds represented by formulae shown below; and $X_1$ and $X_2$ each independently represent an ester group formed at the carboxy group of at least one of the carboxylic acid compounds represented by formulae shown below:

(C1)

$$R_{338}-\overset{O}{\underset{\|}{C}}-OH$$

(C2)

$$HO-\overset{O}{\underset{\|}{C}}-R_{339}-\overset{O}{\underset{\|}{C}}-OH$$

(C3)

$$R_{338}-\overset{O}{\underset{\|}{C}}-R_{339}-\overset{O}{\underset{\|}{C}}-OH$$

(C4)

$$R_{338}-\overset{O}{\underset{\|}{C}}-R_{339}-\overset{O}{\underset{\|}{C}}-R_{339}-\overset{O}{\underset{\|}{C}}-OH$$

(C5)

[Structure C5: Phenyl ring with $(R_{338})_m$ and $(R_{340})_n$ substituents, bearing $-R_{339}-C(=O)-OH$]

(C6)

[Structure C6: Diphenylmethane-type with two phenyl rings bearing $(R_{338})_m$, $(R_{340})_n$, $(R_{340})_q$, $(R_{338})_p$; central carbon bearing $R_{338}$ and $-R_{339}-C(=O)-OH$]

(C7)

[Structure C7: Naphthalene ring with $(R_{338})_m$, $(R_{338})_p$, $(R_{340})_n$, $(R_{340})_q$ substituents, bearing $-(R_{339})_z-C(=O)-OH$]

(C8)

[Structure C8: Benzophenone-type, two phenyl rings joined through C=O, with $(R_{338})_m$, $(R_{338})_p$, $(R_{340})_n$, $(R_{340})_q$ substituents, bearing $-(R_{339})_z-C(=O)-OH$]

(C9)

[Structure C9: Diphenyl ether, two phenyl rings joined through O, with $(R_{338})_m$, $(R_{338})_p$, $(R_{340})_n$, $(R_{340})_q$ substituents, bearing $-(R_{339})_z-C(=O)-OH$]

(C10)

[Structure C10: Fluorene ring with $(R_{338})_m$ and $(R_{340})_n$ substituents, bearing $-(R_{339})_z-C(=O)-OH$]

wherein $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 1 to 20 carbon atoms, a straight chain, branched or cyclic alkynyl group having from 1 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms; $R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 1 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxyalkylene group having from 2 to 20 carbon atoms; the plural $R_{338}$'s and $R_{339}$'s may be the same or different from each other; $R_{340}$ represents a hydroxy group or a halogen atom; the plural $R_{340}$'s may be the same or different from each other; m, n, p and q each independently represent an integer of from 0 to 3, provided that $m+n \leq 5$ and $p+q \leq 5$; and z represents 0 or 1.

16. The positive resist composition as claimed in claim 1, which further comprises an organic basic compound.

17. The positive resist composition as claimed in claim 16, wherein the organic basic compound is a compound having a structure represented by any one of formulae (A) to (E) shown below:

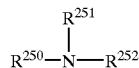

(A)

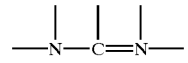

(B)

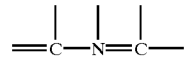

(C)

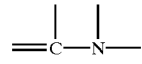

(D)

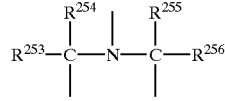

(E)

wherein $R^{250}$ $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be connected with each other to form a ring; and $R^{253}$, $R^{254}$, $R^{255}$ and $R^{256}$, which may be the same or different, each represent an alkyl group having from 1 to 6 carbon atoms.

* * * * *